US012666762B2

(12) United States Patent
Jeon et al.

(10) Patent No.: US 12,666,762 B2
(45) Date of Patent: Jun. 23, 2026

(54) LIGHT-EMITTING ELEMENT HAVING MULTILAYERED LIGHT-EMITTING LAYER, AND DISPLAY DEVICE INCLUDING THE SAME

(71) Applicant: Samsung Display Co., LTD., Yongin-si (KR)

(72) Inventors: Sang Ho Jeon, Hwaseong-si (KR); Ji Song Chae, Yongin-si (KR); Sang Hoon Lee, Suwon-si (KR); Jin Hyuk Jang, Hwaseong-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 698 days.

(21) Appl. No.: 17/978,379

(22) Filed: Nov. 1, 2022

(65) Prior Publication Data

US 2023/0275187 A1    Aug. 31, 2023

(30) Foreign Application Priority Data

Feb. 28, 2022    (KR) ........................ 10-2022-0025697

(51) Int. Cl.
H10H 20/825        (2025.01)
H01L 25/075        (2006.01)
          (Continued)

(52) U.S. Cl.
CPC ........ H10H 20/825 (2025.01); H10H 20/819 (2025.01); H10H 20/8312 (2025.01); H10H 20/857 (2025.01); H10W 90/00 (2026.01)

(58) Field of Classification Search
CPC ............... H10H 20/825; H10H 20/819; H10H 20/8312; H10H 20/857; H10H 20/823;
          (Continued)

(56) References Cited

U.S. PATENT DOCUMENTS 5,889,295 A * 3/1999 Rennie ................ H01S 5/32341
                                                              257/15
2019/0378953 A1* 12/2019 Min ..................... H10H 20/831
                          (Continued)

FOREIGN PATENT DOCUMENTS

KR     10-2006-0035424        4/2006

OTHER PUBLICATIONS

Dharmagunawardhane et al. "Unexpected visible light driven photocatalytic activity without cocatalysts and sacrificial reagents from a (GaN)1-x(ZnO)x solid solution synthesized at high pressure over the entire composition range" RSC adv, 2018, 8, pp. 8976-8982 (Year: 2018).*

(Continued)

*Primary Examiner* — Ratisha Mehta
*Assistant Examiner* — Sophia W Kao
(74) *Attorney, Agent, or Firm* — Womble Bond Dickinson (US) LLP

(57)                ABSTRACT

A light-emitting element and a display device including the same are provided. The light-emitting element includes a first semiconductor layer doped with a first-type dopant, a second semiconductor layer doped with a second-type dopant, and a light-emitting layer disposed between the first semiconductor layer and the second semiconductor layer. The light-emitting layer includes at least one first material layer and at least one second material layer, wherein the at least one first material layer includes a zinc oxide (ZnO)-based material, and the at least one second material layer includes a gallium nitride (GaN)-based material.

19 Claims, 18 Drawing Sheets

(51) Int. Cl.

| | |
|---|---|
| *H10H 20/819* | (2025.01) |
| *H10H 20/831* | (2025.01) |
| *H10H 20/857* | (2025.01) |
| *H10W 90/00* | (2026.01) |

(58) Field of Classification Search
CPC .. H10H 20/812; H10H 20/813; H10H 29/142; H10H 20/811; H10H 20/831; H01L 25/0753; H01L 25/167
See application file for complete search history.

(56) References Cited

U.S. PATENT DOCUMENTS

2020/0393936 A1* 12/2020 Bok ..................... G06F 3/0446
2022/0052227 A1    2/2022 Kim et al.

OTHER PUBLICATIONS

Wang Zhenhai et al: "Hybrid density functional study of band alignment in ZnO-GaN and ZnO-(Ga1 -xZnx) (N1-xOx)-GaN heterostructures", Physical Chemistry Chemical Physics, vol. 14, No. 45, Sep. 25, 2012, pp. 15693-15698.
Extended European Search Report for European Application No. 23151265.8, dated Nov. 23, 2023.
Matthias Auf der Maur et al., "Efficiency Drop in Green InGaN= GaN Light Emitting Diodes: The Role of Random Alloy Fluctuations", Physical Review Letters, Jan. 15, 2016, pp. 1-5, vol. 116, No. 2.
A. Ougazzaden et al., "Epitaxial MOVPE growth of highly c-axis oriented InGaN/GaN films on ZnO-buffered Si (111) substrates", Proc. of SPIE, 2010, pp. 1-8, vol. 7603.
M. H. Kane et al., "Gallium nitride (GaN) on silicon substrates for LEDs", Woodhead Publishing Limited, 2014, pp. 99-143.
Stephan Figge et al., "InGaN quantum dot growth in the limits of Stranski-Krastanov and spinodal decomposition", Physica Status Solidi B, Jul. 22, 2011, pp. 1765-1776, vol. 248, No. 8.
D S Arteev et al., "Investigation of Statistical Broadening in InGaN Alloys", Journal of Physics: Conference Series, 2018, pp. 1-5, vol. 1135.
Fenglin Xian et al., "Large bandgap tunability of GaN/ZnO pseudobinary alloys through combined engineering of anions and cations", Applied Physics Letters, Dec. 3, 2019, pp. 1-5, vol. 115.
Li Li et al., "Phase diagram, structure, and electronic properties of (Ga1-xZnx)(N1-xOx) solid solutions from DFT-based simulations", Physical Review B, Apr. 11, 2011, pp. 1-6, vol. 83. No. 13.
Yong-Nian Xu et al., "Electronic, optical and structural properties of some wurtzite crystals", Physical Review B, Aug. 15, 1993, pp. 4335-4351, vol. 48, No. 7.

* cited by examiner (a) ZnO/GaN (b) InGaN/GaN

Figure 15:
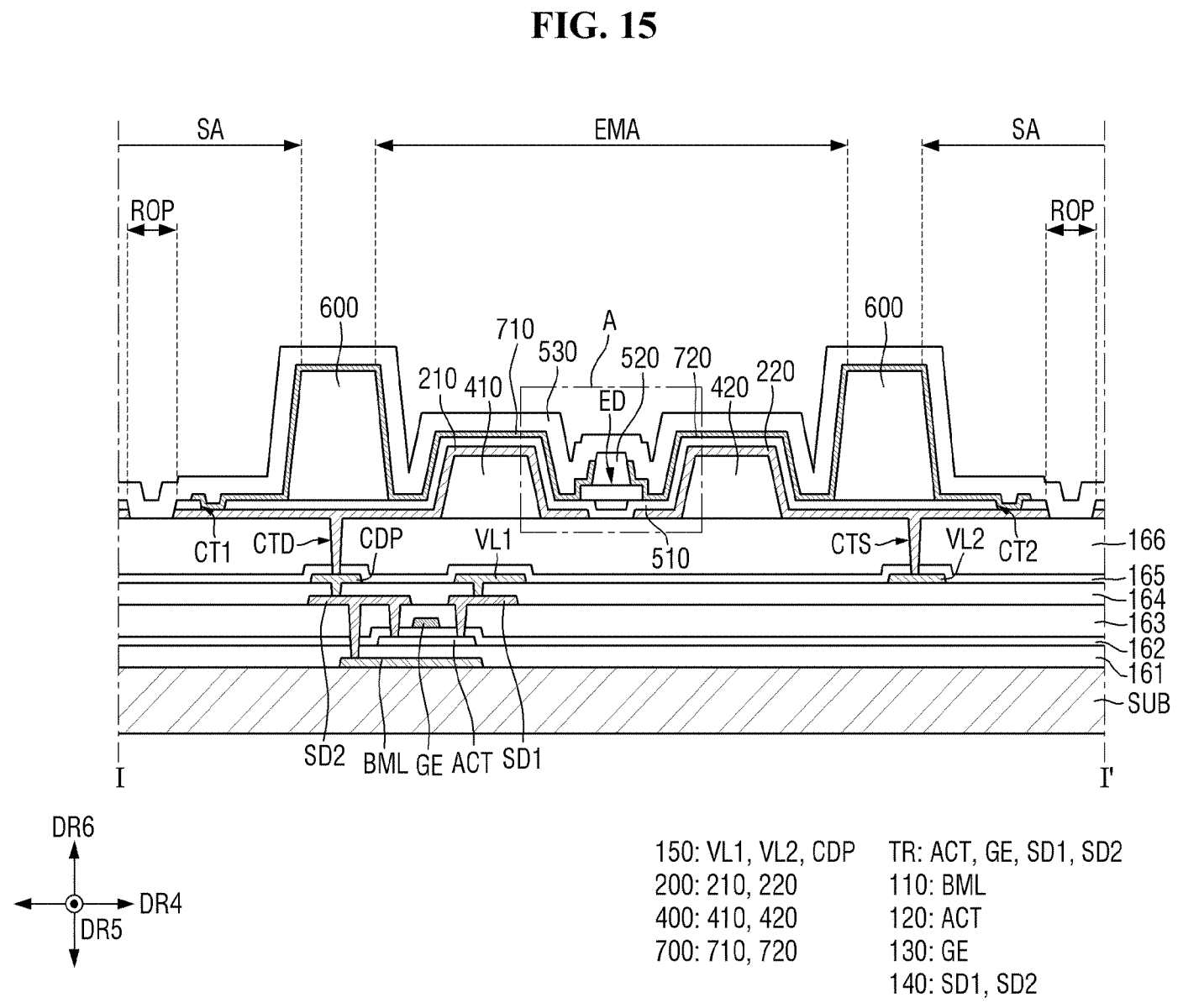

166
165
164
163
162
161
SUB

TR: ACT, GE, SD1, SD2
110: BML
120: ACT
130: GE
140: SD1, SD2

150: VL1, VL2, CDP
200: 210, 220
400: 410, 420
700: 710, 720

DR6
DR4
DR5

200 : 210, 220
200 : 210, 220
400 : 410, 420
700 : 710, 720
ED : 31, 32, 33, 37, 38

DR6
DR4
DR5

200 : 210, 220
200 : 210, 220
400 : 410, 420
700_1 : 710, 720_1
ED : 31, 32, 33, 37, 38

200 : 210, 220
200 : 210, 220
400 : 410, 420
700 : 710, 720
ED_1 : 31, 32, 33_1, 37, 38

LIGHT-EMITTING ELEMENT HAVING MULTILAYERED LIGHT-EMITTING LAYER, AND DISPLAY DEVICE INCLUDING THE SAME

CROSS-REFERENCE TO RELATED APPLICATION(S)

This application claims priority to and benefits of Korean Patent Application No. 10-2022-0025697 under 35 U.S.C. 119, filed on Feb. 28, 2022, in the Korean Intellectual Property Office, the entire contents of which are incorporated herein by reference.

BACKGROUND

1. Technical Field

The disclosure relates to a light-emitting element and a display device including the same.

2. Description of the Related Art

Display devices are becoming more important with developments in multimedia technology. Accordingly, various display devices such as an organic light-emitting diode (OLED) display device, a liquid crystal display (LCD) device, and the like have been used.

Typically, a display device, which displays an image, includes a display panel such as an OLED display panel or an LCD panel. The display panel may include light-emitting elements, and the light-emitting elements may be light-emitting diodes (LEDs). Examples of the LEDs include organic LEDs (OLEDs) using an organic material as a light-emitting material and inorganic LEDs using an inorganic material as a light-emitting material.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a light-emitting element having a light-emitting layer with an improved quantum efficiency and a display device including the light-emitting element.

However, aspects of the disclosure are not restricted to those set forth herein. The above and other aspects of the disclosure will become more apparent to one of ordinary skill in the art to which the disclosure pertains by referencing the detailed description of the disclosure given below.

According to an aspect of the disclosure, a light-emitting element may include a first semiconductor layer doped with a first-type dopant, a second semiconductor layer doped with a second-type dopant, and a light-emitting layer disposed between the first and second semiconductor layers, wherein the light-emitting layer may include at least one first material layer, and at least one second material layer. The at least one first material layer may include a zinc oxide (ZnO)-based material, and the at least one second material layer may include a gallium nitride (GaN)-based material.

In an embodiment, the light-emitting layer may be a multilayer in which a plurality of first material layers and a plurality of second material layers may be alternately stacked.

In an embodiment, a bandgap energy of the at least one first material layer may be less than a bandgap energy of the at least one second material layer.

In an embodiment, the light-emitting layer may include $(GaN)_{1-x}(ZnO)_x$, and x may be in a range of about 0.22 to about 0.75.

In an embodiment, a wavelength of light emitted from the light-emitting layer may be in a range of about 450 nm to about 495 nm.

In an embodiment, the light-emitting layer may include $(GaN)_{1-x}(ZnO)_x$, and x may be equal to or less than about 0.22.

In an embodiment, a wavelength of light emitted from the light-emitting layer may be in a range of about 495 nm to about 550 nm.

In an embodiment, a bandgap energy of the light-emitting layer may be in a range of about 2.2 eV to about 2.7 eV.

In an embodiment, light emitted from the light-emitting layer may have a quantum efficiency of equal to or greater than about 79%.

In an embodiment, a rate of lattice mismatch between the at least one first material layer and the at least one second material layer may be equal to or less than about 1.8%.

In an embodiment, the at least one first material layer may further include indium (In).

In an embodiment, a wavelength of light emitted from the light-emitting layer may be in a range of about 550 nm to about 690 nm.

In an embodiment, a bandgap energy of the light-emitting layer may be in a range of about 1.8 eV to about 2.2 eV.

In an embodiment, an In content of the first material layer may be equal to or less than about 10%.

In an embodiment, the light-emitting element may have a rod shape having an aspect ratio in a range of about 1.2:1 to about 100:1.

In an embodiment, the light-emitting element may further include a device electrode layer disposed on the second semiconductor layer, and an insulating film surrounding outer surfaces of each of the first semiconductor layer, the light-emitting layer, and the second semiconductor layer.

According to an aspect of the disclosure, a display device may include a first electrode and a second electrode, each disposed on a substrate and spaced apart from each other, a light-emitting element disposed between the first and second electrodes, the light-emitting element having a first end portion and a second end portion, a first connecting electrode contacting the first end portion of the light-emitting element, and a second connecting electrode contacting the second end portion of the light-emitting element. The light-emitting element may include a first semiconductor layer, a second semiconductor layer, and a light-emitting layer, which may be disposed between the first semiconductor layer and the second semiconductor layer. The light-emitting layer may include at least one first material layer, which may include a zinc oxide (ZnO)-based material, and at least one second material layer, which may include a gallium nitride (GaN)-based material.

In an embodiment, the at least one first material layer and the at least second material layer may be alternately arranged in a direction parallel to one surface of the substrate.

In an embodiment, the light-emitting layer may include $(GaN)_{1-x}(ZnO)_x$, and x may be in a range of about 0.22 to about 0.75.

In an embodiment, the at least one first material layer may further include indium (In) in an amount equal to or less than about 10%.

According to the aforementioned and other embodiments of the disclosure, a light-emitting element may include a light-emitting layer including a zinc oxide (ZnO)-based material and a gallium nitride (GaN)-based material. Accordingly, the light-emitting element and a display device including the light-emitting element can emit visible light in a visible wavelength band with an improved quantum efficiency.

It is to be understood that the embodiments above are described in a generic and explanatory sense only and not for the purpose of limitation, and the disclosure is not limited to the embodiments described above.

BRIEF DESCRIPTION OF THE DRAWINGS

The above and other aspects and features of the disclosure will become more apparent by describing in detail embodiments thereof with reference to the attached drawings, in which:

FIG. 15 is a schematic cross-sectional view taken along line I-I' of FIG. 14;

DETAILED DESCRIPTION OF THE EMBODIMENTS

Figure 1:
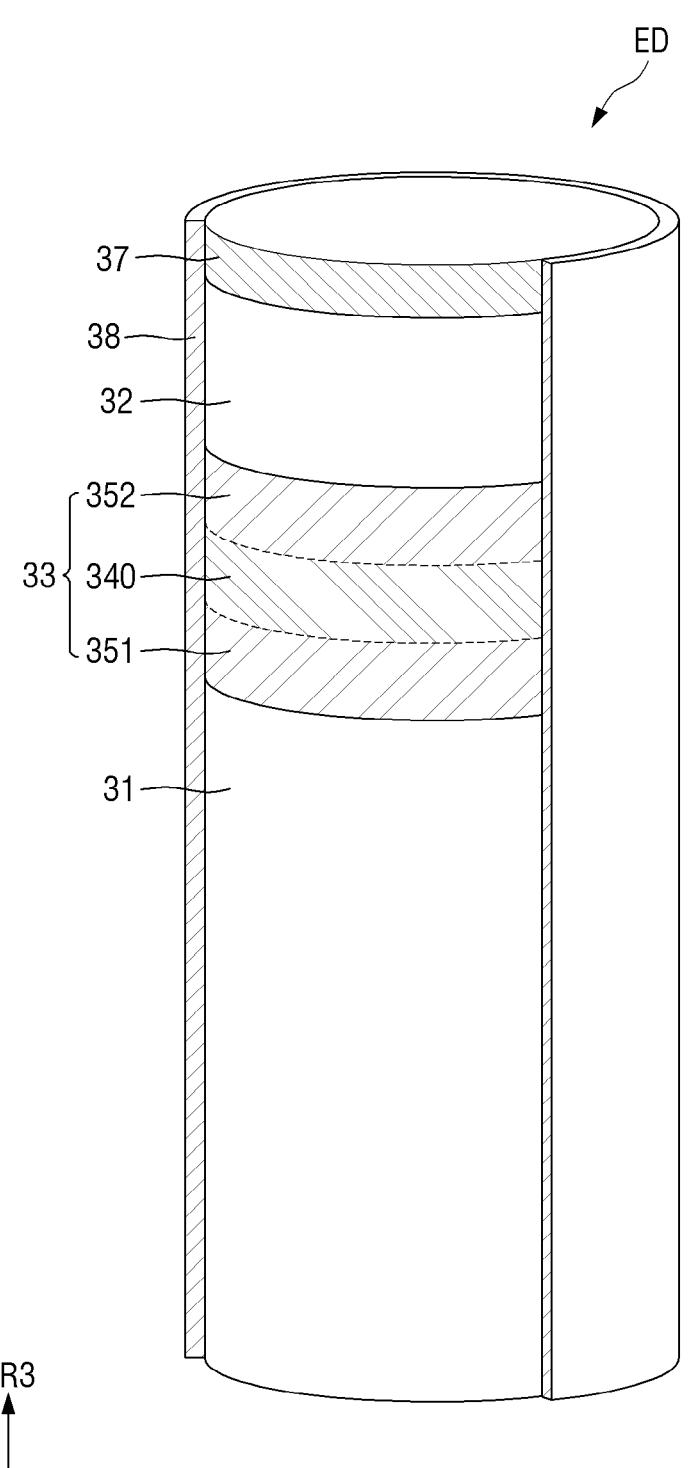
FIG. 1 is a schematic perspective view of a light-emitting element according to an embodiment of the disclosure.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, the sizes, thicknesses, ratios, and dimensions of the elements may be exaggerated for ease of description and for clarity. Like numbers refer to like elements throughout.

In the description, it will be understood that when an element (or region, layer, part, etc.) is referred to as being "on", "connected to", or "coupled to" another element, it can be directly on, connected to, or coupled to the other element, or one or more intervening elements may be present therebetween. In a similar sense, when an element (or region, layer, part, etc.) is described as "covering" another element, it can directly cover the other element, or one or more intervening elements may be present therebetween.

In the description, when an element is "directly on," "directly connected to," or "directly coupled to" another element, there are no intervening elements present. For example, "directly on" may mean that two layers or two elements are disposed without an additional element such as an adhesion element therebetween.

It will be understood that the terms "connected to" or "coupled to" may include a physical or electrical connection or coupling.

As used herein, the expressions used in the singular such as "a," "an," and "the," are intended to include the plural forms as well, unless the context clearly indicates otherwise.

As used herein, the term "and/or" includes any and all combinations of one or more of the associated listed items. For example, "A and/or B" may be understood to mean "A, B, or A and B." The terms "and" and "or" may be used in the conjunctive or disjunctive sense and may be understood to be equivalent to "and/or".

In the specification and the claims, the term "at least one of" is intended to include the meaning of "at least one selected from the group of" for the purpose of its meaning and interpretation. For example, "at least one of A and B" may be understood to mean "A, B, or A and B." When preceding a list of elements, the term, "at least one of," modifies the entire list of elements and does not modify the individual elements of the list.

It will be understood that, although the terms first, second, etc. may be used herein to describe various elements, these elements should not be limited by these terms. These terms are only used to distinguish one element from another element. Thus, a first element could be termed a second element without departing from the teachings of the disclosure. Similarly, a second element could be termed a first element, without departing from the scope of the disclosure.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "about" or "approximately" as used herein is inclusive of the stated value and means within an acceptable range of deviation for the recited value as determined by one of ordinary skill in the art, considering the measurement in question and the error associated with measurement of the recited quantity (i.e., the limitations of the measurement system). For example, "about" may mean within one or more standard deviations, or within ±20%, ±10%, or ±5% of the stated value.

It should be understood that the terms "comprises," "comprising," "includes," "including," "have," "having," "contains," "containing," and the like are intended to specify the presence of stated features, integers, steps, operations, elements, components, or combinations thereof in the disclosure, but do not preclude the presence or addition of one or more other features, integers, steps, operations, elements, components, or combinations thereof.

Each of the features of the various embodiments of the disclosure may be combined or combined with each other, in part or in whole, and technically various interlocking and driving are possible. Each embodiment may be implemented independently of each other or may be implemented together in an association.

Unless otherwise defined or implied herein, all terms (including technical and scientific terms) used have the same meaning as commonly understood by those skilled in the art to which this disclosure pertains. It will be further understood that terms, such as those defined in commonly used dictionaries, should be interpreted as having a meaning that is consistent with their meaning in the context of the relevant art and should not be interpreted in an ideal or excessively formal sense unless clearly defined in the specification Embodiments of the disclosure will hereinafter be described with reference to the accompanying drawings.

Figure 2:
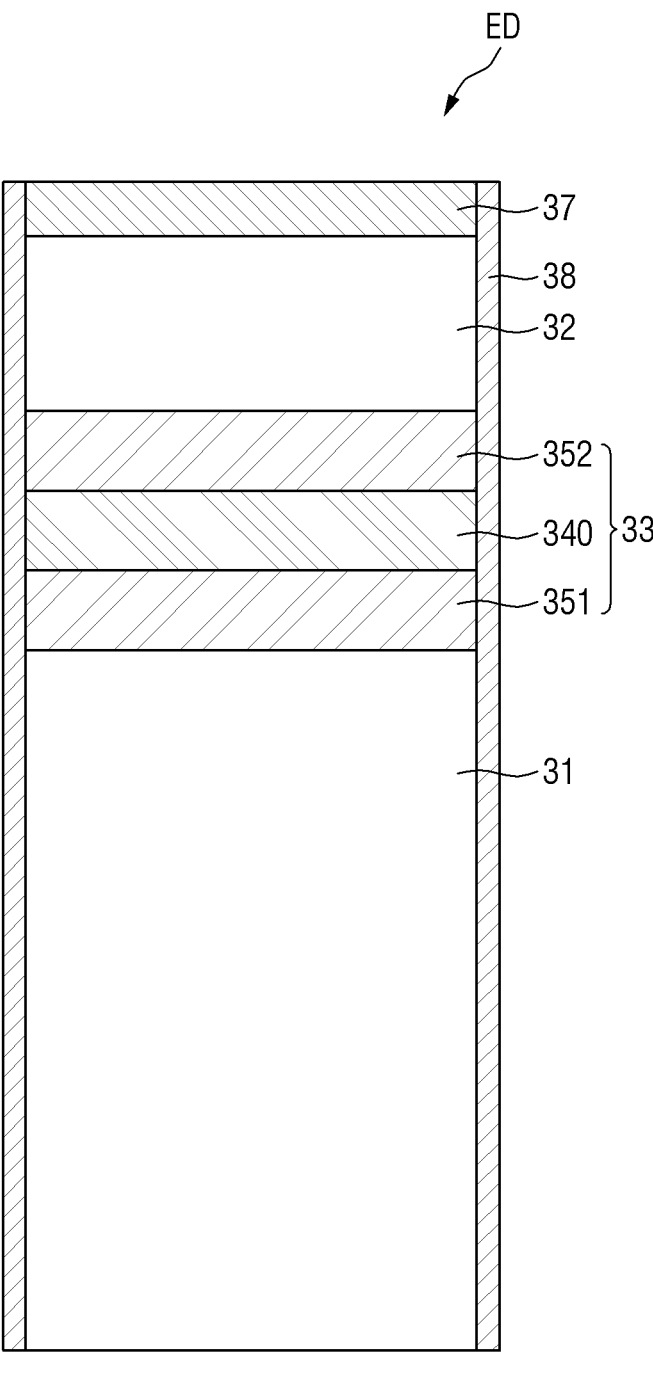
FIG. 2 is a schematic cross-sectional view of the light-emitting element of FIG. 1.
Figure 2:
Figure 3:
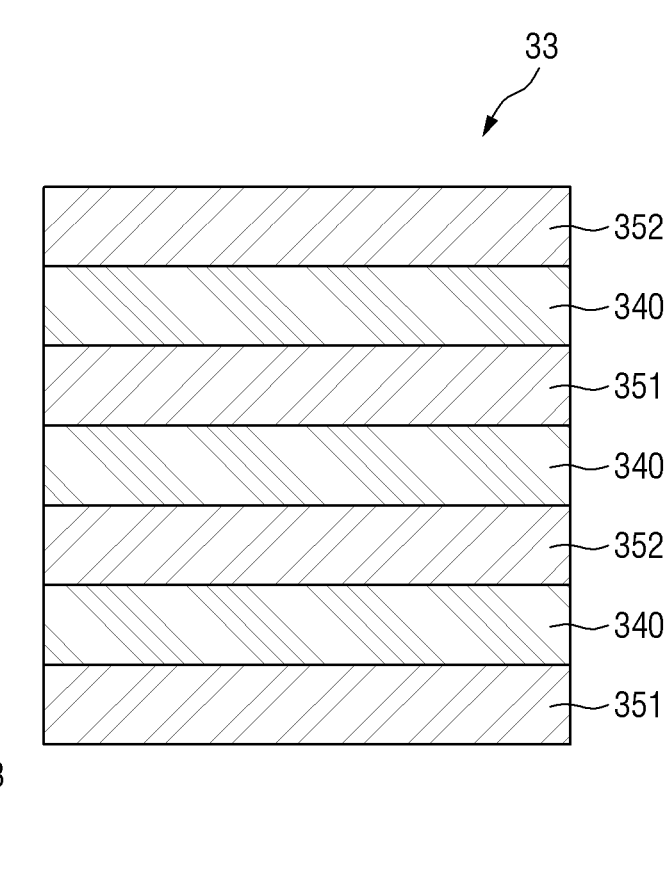
FIG. 3 is a schematic cross-sectional view of a light-emitting layer of a light-emitting element according to another embodiment of the disclosure.
Figure 4:
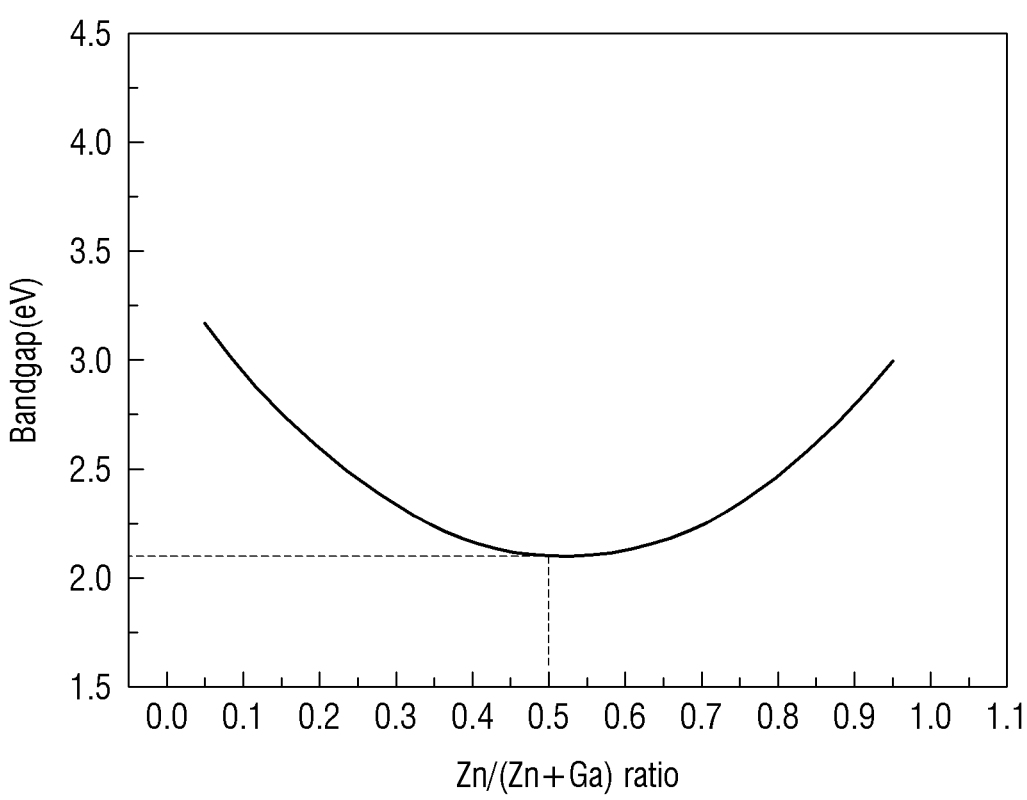
FIG. 4 is a graph showing the zinc oxide (ZnO) content and a bandgap energy of a first material layer of the light-emitting element of FIG. 1.

FIG. 1 is a schematic perspective view of a light-emitting element according to an embodiment of the disclosure. FIG. 2 is a schematic cross-sectional view of the light-emitting element of FIG. 1. FIG. 3 is a schematic cross-sectional view of a light-emitting layer of a light-emitting element according to another embodiment of the disclosure. FIG. 4 is a graph showing the zinc oxide (ZnO) content and the bandgap energy of a first material layer of the light-emitting element of FIG. 1.

Referring to FIGS. 1 and 2, a light-emitting element ED, which may be a particulate device, may have a rod or cylindrical shape having an aspect ratio. The light-emitting element ED may extend in one direction, and the length, in the direction of extension, of the light-emitting element ED may be greater than the diameter of the light-emitting element ED. For example, the light-emitting element ED may have a cylindrical shape, a rod shape, a wire shape, a tube shape, or a polygonal column shape such as a cube shape, a cuboid shape, or a hexagonal prism shape. In another example, the light-emitting element may generally extend in the direction of extension of the light-emitting element ED, and may be partially inclined on the outside. Here, the "one direction", the direction of extension of the light-emitting element ED, and the longitudinal direction of the light-emitting element ED may be used interchangeably and will hereinafter be referred to as the longitudinal direction DR3.

The light-emitting element ED may have a nanometer scale (e.g., a size in a range of about 1 nm to about 1 μm) or a micrometer scale (e.g., a size in a range of about 1 μm to about 1 mm). The length, in the longitudinal direction DR3, of the light-emitting element ED may be in a range of about 1 μm to about 10 μm, and the diameter of the light-emitting element ED may be about 500 nm. For example, the length, in the longitudinal direction DR3, of the light-emitting element ED may be in a range of about 4 μm to about 5 μm. The aspect ratio of the light-emitting element ED may be in a range of about 1.2:1 to about 100:1, but the disclosure is not limited thereto.

The light-emitting element ED may be an inorganic light-emitting diode (LED) formed of an inorganic material. The inorganic LED may include semiconductor layers. For example, the inorganic LED may include a first conductivity type (e.g., n-type) semiconductor layer, a second conductivity type (e.g., p-type) semiconductor layer, and an active semiconductor layer disposed between the first and second conductivity type semiconductor layers. The active semiconductor layer may receive holes and electrons from the first and second conductivity type semiconductor layers, and the holes and the electrons may combine together to emit light. The inorganic LED may be aligned between two opposite electrodes if an electric field may be formed between the two electrodes in a particular direction.

The light-emitting element ED may include a first semiconductor layer 31, a second semiconductor layer 32, a light-emitting layer 33, a device electrode layer 37, and an insulating film 38. The first semiconductor layer 31, the second semiconductor layer 32, the light-emitting layer 33, and the device electrode layer 37 may be sequentially stacked in the longitudinal direction of the light-emitting element ED, i.e., in the longitudinal direction DR3.

The first semiconductor layer 31 may include an n-type semiconductor. The first semiconductor layer 31 may include a semiconductor material, i.e., $Al_xGa_yIn_{1-x-y}N$ (where $0 \leq x \leq 1$, $0 \leq y \leq 1$, and $0 \leq x+y \leq 1$). For example, the first semiconductor layer 31 may include at least one of AlGaInN, GaN, AlGaN, InGaN, AlN, and InN that may be doped with an n-type dopant. The n-type dopant may be Si, Ge, Sn, or Se.

The second semiconductor layer 32 may be disposed on the first semiconductor layer 31 with the light-emitting layer 33 interposed therebetween. The second semiconductor layer 32 may include a p-type semiconductor. The second semiconductor layer 32 may include a semiconductor material, i.e., $Al_xGa_yIn_{1-x-y}N$ (where $0 \leq x \leq 1$, $0 \leq y \leq 1$, and $0 \leq x+y \leq 1$). For example, the second semiconductor layer 32 may include at least one of AlGaInN, GaN, AlGaN, InGaN, AlN, and InN that may be doped with a p-type dopant. The p-type dopant may be Mg, Zn, Ca, or Ba.

FIG. 2 illustrates that the first and second semiconductor layers 31 and 32 may be formed as single layers, but the disclosure is not limited thereto. In other embodiments, each of the first and second semiconductor layers 31 and 32 may include more than one layer such as, for example, a clad layer or a tensile strain barrier reducing (TSBR) layer, depending on the material of the light-emitting layer 33. For example, the light-emitting element ED may further include a semiconductor layer between the first semiconductor layer 31 and the light-emitting layer 33 or a semiconductor layer between the second semiconductor layer 32 and the light-emitting layer 33. The semiconductor layer between the first semiconductor layer 31 and the light-emitting layer 33 may include at least one of AlGaInN, GaN, AlGaN, InGaN, AlN, InN, and SLs that may be doped with an n-type dopant, and the semiconductor layer between the second semiconductor layer 32 and the light-emitting layer 33 may include at least one of AlGaInN, GaN, AlGaN, InGaN, AlN, and InN that may be doped with a p-type dopant.

The light-emitting layer 33 may be disposed between the first and second semiconductor layers 31 and 32. The light-emitting layer 33 may include a first material layer 340 and second material layers 351 and 352 and the light-emitting layer 33 may have a multi-quantum well structure.

In case that the light-emitting layer 33 has a multi-quantum well structure, the light-emitting layer 33 may be a multi-layer film in which the first material layer 340 and the second material layers 351 and 352 may be alternately stacked. The first material layer 340 may be a well layer where electrons and holes injected into the light-emitting layer 33 recombine together, and the second material layers 351 and 352 may be barrier layers that function as an energy barrier. The bandgap energy of the first material layer 340 may be lower than the bandgap energy of the second material layers 351 and 352.

The first material layer 340 may be disposed between second material layers 351 and 352. FIG. 2 illustrates that the second material layer 351, which may be a first barrier layer, may be disposed below the first material layer 340 and the second material layer 352, which may be a second barrier layer, may be disposed above the first material layer 340, but the disclosure is not limited thereto. In other embodiments, the light-emitting layer 33 may be a multi-layer film in which first material layers 340 and second material layers 351 or 352 may be alternately stacked, as illustrated in FIG. 3.

The light-emitting layer 33 may emit light through the combination of electrons from the first semiconductor layer 31 and holes from the second semiconductor layer 32. The light-emitting layer 33 may emit light in a visible wavelength band, for example, blue-wavelength light, green-wavelength light, and red-wavelength light. The first material layer 340 may include a semiconductor material having a bandgap energy corresponding to the blue-wavelength light, the green-wavelength light, and the red-wavelength light. The wavelength band of light emitted by the light-emitting layer 33 may vary depending on the content ratio of the first material layer 340 and the second material layers 351 and 352.

For example, the first material layer 340 may include a group II-VI compound-based material, for example, a ZnO-based material. The second material layers 351 and 352 may include a gallium nitride (GaN)-based material, for example, GaN or AlGaN. The light-emitting layer 33 may include a semiconductor material, i.e., $(GaN)_{1-x}(ZnO)_x$ (where $0 \leq x \leq 1$) or GaZnNO, and may have a structure where the first material layer 340 and the second material layers 351 and 352 may be alternately stacked. The zinc (Zn) content of the light-emitting layer 33 may be controlled such that the light-emitting layer 33 may have a bandgap energy corresponding to the visible wavelength band.

FIG. 4 shows the variation of the bandgap energy of the light-emitting layer 33 with the ZnO—GaN composition ratio of the light-emitting layer 33. Referring to FIG. 4, the X axis represents x in $(GaN)_{1-x}(ZnO)_x$, and the Y axis represents the bandgap energy of the light-emitting layer 33. The Zn content of the light-emitting layer 33 increases from the left to the right on the X axis, and the bandgap energy of the light-emitting layer 33 increases from the bottom to the top on the Y axis.

The light-emitting layer 33 may emit light of different colors depending on the composition ratio of ZnO in the first material layer 340 and GaN in the second material layers 351 and 352.

In case that x is equal to or less than about 0.22 or x is equal to or greater than about 0.75, a bandgap energy of light emitted from the light-emitting layer 33 may be in a range of about 2.5 eV to about 2.7 eV. In this regard, light emitted from the light-emitting layer 33 may be blue-wavelength light having a wavelength in a range of about 450 nm to about 495 nm.

In case that x is in a range of about 0.22 to about 0.75, a bandgap energy of light emitted from the light-emitting layer 33 may be in a range of about 2.2 eV to about 2.5 eV. Light emitted from the light-emitting layer 33 may be green-wavelength light having a wavelength in a range of about 495 nm to about 550 nm.

For example, in case that x is 0.5, a bandgap energy of light emitted from the light-emitting layer 33 may be reduced to about 2.2 eV. A bandgap energy of light emitted from the light-emitting layer 33 may be lowered to that of a green-wavelength light by controlling the ZnO content of the light-emitting layer 33.

In case that the light-emitting layer 33 further contains indium (In), the light-emitting layer 33 may emit light in a wavelength range of about 550 nm to about 690 nm, i.e., red-wavelength light. This will be described later in detail with reference to FIG. 6.

As the ZnO content of the light-emitting layer 33 is controlled such that the light-emitting layer 33 emits blue-, green-, or red-wavelength light, any decrease in quantum efficiency may be improved. For example, the light-emitting layer 33 can emit blue-, green-, or red-wavelength light with a high quantum efficiency. This will be described later in detail with reference to FIG. 5.

Light may be emitted from the light-emitting layer 33 not only through both end surfaces, in the longitudinal direction DR3, of the light-emitting element ED, but also through the side of the light-emitting element ED. The direction in which light may be emitted from the light-emitting layer 33 is not particularly limited.

The device electrode layer 37 may be an ohmic connecting electrode, but the disclosure is not limited thereto. In other embodiments, the device electrode layer 37 may be a Schottky connecting electrode. The light-emitting element ED may include at least one electrode layer 37. The light-emitting element ED may include more than one electrode layer 37, but the disclosure is not limited thereto. In other embodiments, the device electrode layer 37 may not be provided.

The device electrode layer 37 may reduce the resistance between the light-emitting element ED and electrodes or (connecting electrodes) in case that the light-emitting element ED is electrically connected to the electrodes or to the connecting electrodes. The device electrode layer 37 may include a conductive metal. For example, the device electrode layer 37 may include at least one of Al, Ti, In, Au, Ag, ITO, IZO, and IZTO.

The insulating film 38 may be disposed to surround the first and second semiconductor layers 31 and 32 and the device electrode layer 37. For example, the insulating film 38 may be disposed to surround at least the light-emitting layer 33, and may expose both end portions, in the longitudinal direction, of the light-emitting element ED. The insulating film 38 may be formed to be rounded in a cross-sectional view, in a region adjacent to at least one end of the light-emitting element ED.

The insulating film 38 may include a material with insulating properties such as, for example, silicon oxide $(SiO_x)$, silicon nitride $(SiN_x)$, silicon oxynitride $(SiO_xN_y)$, aluminum nitride $(AlN_x)$, aluminum oxide $(AlO_x)$, zirconium oxide $(ZrO_x)$, hafnium oxide $(HfO_x)$, and titanium oxide $(TiO_x)$. The insulating film 38 may be illustrated as being a single-layer film, but the disclosure is not limited thereto. In some embodiments, the insulating film 38 may be formed as a multilayer film in which multiple layers may be stacked.

The insulating film 38 may protect the first and second semiconductor layers 31 and 32 and the device electrode layer 37. The insulating film 38 can prevent a short circuit that may occur in the light-emitting layer 33 in case that the light-emitting element ED directly contacts electrodes to which electric signals may be applied. The insulating film 38 can prevent the degradation of the emission efficiency of the light-emitting element ED.

The outer surface of the insulating film 38 may be subjected to surface treatment. The light-emitting element ED may be sprayed on electrodes while being dispersed in an ink. Here, the surface of the insulating film 38 may be hydrophobically or hydrophilically treated to keep the light-emitting element ED dispersed in ink without agglomerating with other neighboring light-emitting elements ED.

Figure 5:
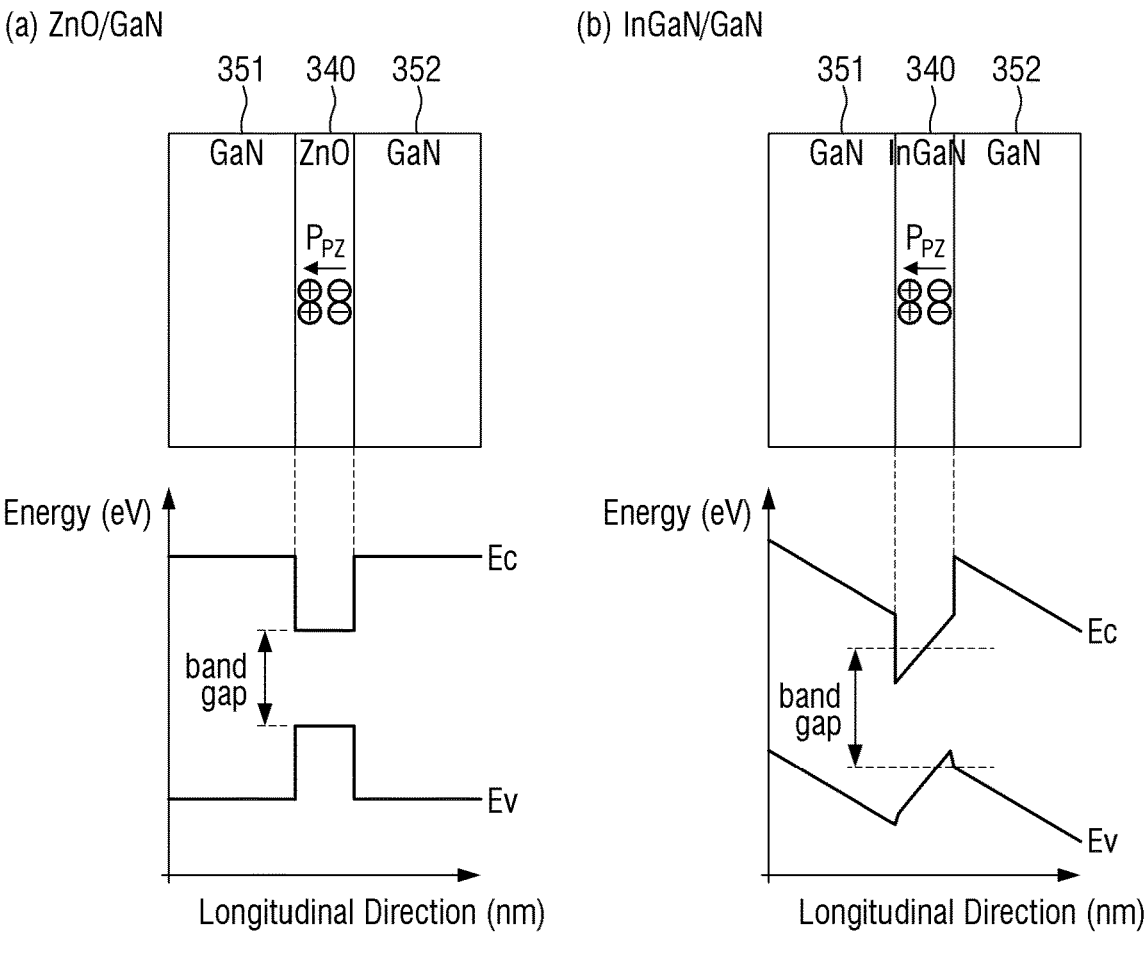
FIG. 5 shows an energy level of the light-emitting layer of the light-emitting element of FIG. 1 and an energy level of a light-emitting layer of a light-emitting element according to a comparative example.

FIG. 5 shows the energy level of the light-emitting layer of the light-emitting element of FIG. 1 and the energy level of a light-emitting layer of a light-emitting element according to a comparative example.

FIG. 5($a$) illustrates the first material layer 340 and the second material layers 351 and 352 of the light-emitting layer 33 and the energy level of the light-emitting layer 33 along a longitudinal direction, and FIG. 5($b$) illustrates a light-emitting layer according to the comparative example and the energy level of the light-emitting layer according to the comparative example along the longitudinal direction. The light-emitting layer according to the comparative example includes GaN barrier layers and an InGaN well layer interposed between the GaN barrier layers.

Referring to Table 1 below, the first material layer 340 of the light-emitting layer 33 may have a similar lattice constant to the second material layers 351 and 352 of the light-emitting layer 33. On the contrary, the difference in lattice constant between the InGaN well layer and the GaN barrier layers of the light-emitting layer according to the comparative example may be relatively large. The lattice constant, may be a constant that determines the crystal geometry of the material of the light-emitting layer 33 and may define the arrangement of atoms that are repeatedly arranged with regularity in a three-dimensional (3D) space. The lattice constant may be expressed as the dimensions (e.g., x-, y-, and z-axis lengths a, b, and c) of each unit cell, which is the smallest repeating unit of a lattice.

TABLE 1

| Lattice Parameter | a (Å) | c (Å) | Mismatch Rate (%) |
|---|---|---|---|
| InGaN | 3.533 | 5.692 | 10.8% |
| GaN | 3.19 | 5.189 | — |
| ZnO | 3.249 | 5.207 | 1.8% |

Referring to Table 1, the lattice constant (or the x- or z-axis length a or c) of the first material layer 340 may be close to the lattice constant (or the x- or z-axis length a or c) of the second material layers 351 and 352. A rate of lattice mismatch between the first material layer 340 and the second material layers 351 and 352 may be equal to or less than about 1.8%. On the contrary, the lattice constant (or the x- or z-axis length a or c) of the InGaN well layer of the light-emitting layer according to the comparative example may vastly differ from the lattice constant (or the x- or z-axis length a or c) of the GaN barrier layers of the light-emitting layer according to the comparative example. The rate of lattice mismatch between the InGaN well layer and the GaN barrier layers of the light-emitting layer according to the comparative example may be about 10.8%. For example, the rate of lattice mismatch between the first material layer 340 and the second material layers 351 and 352 may be 10 times less than the rate of lattice mismatch between the InGaN well layer and the GaN barrier layers of the light-emitting layer according to the comparative example.

In case that the light-emitting layer 33 includes a first material layer 340 and second material layers 351 and 352 having a relatively small difference in lattice constant with the first material layer 340, the first material layer 340 and the second material layers 351 and 352 may form a super-lattice structure. For example, ZnO and GaN may form a crystal structure where they are may be arranged with regularity within each unit lattice, without any phase separation, at a temperature in a range of about 0K to about 800K. Any strain between the first material layer 340 and the second material layers 351 and 352 may be minimized.

On the contrary, in a light-emitting layer containing In, i.e., the light-emitting layer according to the comparative example, strain may be generated due to the lattice mismatch between the InGaN well layer and the GaN barrier layers of the light-emitting layer according to the comparative example, and as a result, a quantum-confined stack effect (QCSE) phenomenon and alloy fluctuations that may cause the agglomeration of In may occur.

According to the comparative example, the wavelength of light emitted from a light-emitting layer varies depending on the In content of the light-emitting layer, and the greater the In content of the light-emitting layer, the more the color of light emitted from the light-emitting layer changes from blue to green and from green to red. For example, if the In content of a light-emitting layer is equal to or greater than about 10%, the light-emitting layer may emit green light and red light. As the greater the In content of a light-emitting layer, the greater the lattice constant of the light-emitting layer, the rate of lattice mismatch between the well layer and the barrier layers of the light-emitting layer increases, and the probability of inner defects that may be caused by strain increases. Thus, if the In content of a light-emitting layer is increased such that the light-emitting layer emits green- or red-wavelength light, a QCSE phenomenon where the energy level of the well layer of the light-emitting layer tilts may occur, as shown in FIG. 5($b$), causing a decrease in the quantum efficiency of emitted light and a change in the wavelength of the emitted light, i.e., a color shift phenomenon. In other words, the quantum efficiency of green or red light emitted from a light-emitting layer containing In may be low. For example, at any given current density, the quantum efficiency of the green light may be about 57%, which may be 22% reduced from the quantum efficiency of blue light, i.e., 79%.

Piezoelectric polarization values for causing QCSE according to the embodiment of FIG. 1 and the comparative example and the causes of the improved quantum efficiency of the light-emitting layer 33 will hereinafter be described with reference to Table 2 below.

TABLE 2

| Composition | 16% | 18% | 20% | 22% | 24% | 25% |
|---|---|---|---|---|---|---|
| $P_{PZ\_InGaN}$ | −0.019 | −0.021 | −0.024 | −0.026 | −0.029 | −0.030 |
| $P_{PZ\_ZnO}$ | −0.003 | −0.004 | −0.004 | −0.005 | −0.005 | −0.006 |

The difference in lattice constant between the well layer and the barrier layers of a light-emitting layer may cause piezoelectric polarization, and as a result, dipoles may be generated along the interfaces of the well layer in accordance with the difference in lattice constant between the well layer and the barrier layers of the light-emitting layer. The piezoelectric polarization may be the reason for the tilt of the energy level of the well layer due to QCSE. For example, as the piezoelectric polarization increases, the quantum efficiency of the light-emitting layer decreases.

As is clear from Table 2, a piezoelectric polarization $P_{PZ}$_ZnO of the first material layer 340, which includes ZnO, may be reduced by about 83% from a piezoelectric polarization $P_{PZ}$_InGaN of the InGaN well layer. In case that the light-emitting layer 33 includes the first material layer 340, a tilt in the energy level of a well layer, i.e., a QCSE phenomenon, may be reduced, as shown in FIG. 5(*a*). As a result, the quantum efficiency of the light-emitting layer 33 may be improved, and a change in the wavelength of light emitted from the light-emitting layer 33, i.e., a color shift phenomenon, may be improved. For example, in case that the light-emitting layer 33 contains Zn, the quantum efficiency of green or red light may be identical or similar to the quantum efficiency of blue light. For example, at any given current density, the quantum efficiency of green light may be the same as, or close to, the quantum efficiency of blue light, i.e., 79%.

As the first material layer 340 and the second material layers 351 and 352 of the light-emitting layer 33 form a superlattice structure, the agglomeration of ZnO may be prevented. For example, ZnO may be arranged regularly with GaN without agglomerating, and as a result, alloy fluctuations that may occur in the comparative example, such as the agglomeration of In that may be caused by the difference in lattice constant between the InGaN well layer and the GaN barrier layers, may be prevented. As such alloy fluctuations may be improved, the frequency of non-radiative recombination, which may be a recombination of electrons and holes that does not accompany the emission of light, may be reduced. For example, a decrease in the quantum efficiency of the light-emitting layer 33 may be minimized.

In short, the light-emitting layer 33 may include the first material layer 340, which includes ZnO, and the second material layers 351 and 352, which include GaN. The light-emitting layer 33 may emit light in the blue-, green-, or red-wavelength band depending on the Zn content thereof. For example, in case that the light-emitting layer 33 has a Zn content equal to or greater than of about 22% or a Zn content equal to or greater than about 75%, the light-emitting layer 33 can emit green-wavelength light with an improved quantum efficiency.

A light-emitting element ED_1 according to another embodiment of the disclosure will hereinafter be described.

Figure 6:
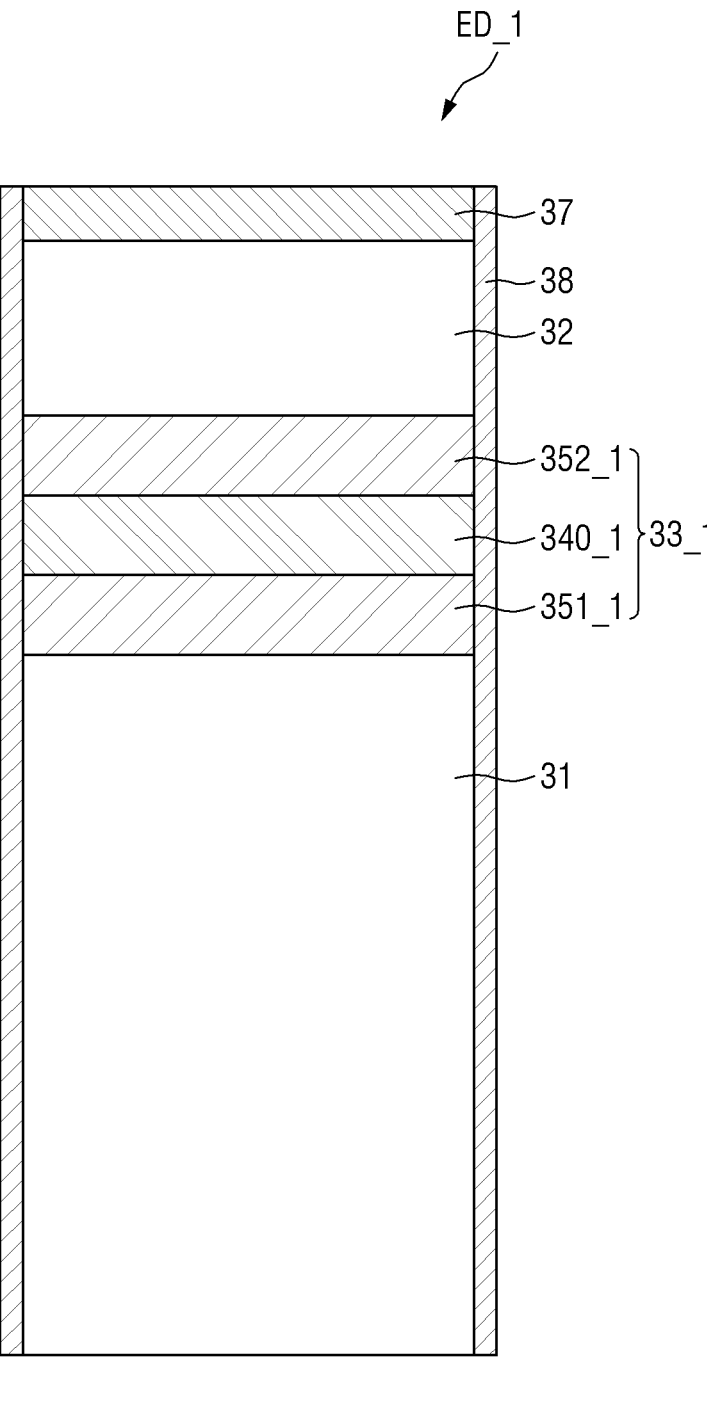
FIG. 6 is a schematic cross-sectional view of a light-emitting element according to another embodiment of the disclosure.
Figure 6:

FIG. 6 is a schematic cross-sectional view of a light-emitting element according to another embodiment of the disclosure.

Referring to FIG. 6, a light-emitting layer 33_1 of the light-emitting element ED_1 may have a multilayer structure in which a first material layer 340_1 and second material layers 351_1 and 352_1 may be alternately stacked. In the light-emitting layer ED_1, a first semiconductor layer 31, the second material layer 351_1, the first material layer 340_1, the second material layer 352_1, a second semiconductor layer 32, and a device electrode layer 37 may be sequentially formed along a longitudinal direction DR3.

The light-emitting layer 33_1, like its counterpart of the previous embodiment, has a multi-quantum well structure in which the first material layer 340_1 and the second material layers 351_1 and 352_1 may be alternately stacked. The light-emitting layer 33_1 may differ its counterpart of the previous embodiment in that the first material layer 340_1 may include ZnO and may further include In. The first material layer 340_1 may include ZnO and In, and the second material layers 351_1 and 352_1 may include GaN. For example, the light-emitting layer 33_1 may include a semiconductor material, i.e., INGaZnON.

As the first material layer 340_1 includes ZnO and In, the wavelength of light emitted from the light-emitting layer 340_1 may be controlled by controlling the Zn and In contents of the first material layer 340_1. The light-emitting layer 33_1 may be able to emit not only blue- or green-wavelength light, but also red-wavelength light.

For example, red-wavelength light with a high quantum efficiency may be emitted by controlling the In content of the first material layer 340_1. As the In content of the first material layer 340_1 increases, light emitted by the first material layer 340_1 may be switched to the red-wavelength band, and as the In content of the first material layer 340_1 decreases, light emitted by the first material layer 340_1 may be switched to the blue-wavelength band. In case that the first material layer 340_1 includes In, the bandgap energy of light emitted by the light-emitting element ED_1 may be lowered such that the light can have the visible wavelength band, and the quantum efficiency of the light may be improved.

For example, in case that the first material layer 340_1 further contains an amount of In in a range of about 0% to about 20%, a bandgap energy of light emitted by the light-emitting layer 33_1 may be lowered to a range of about 1.8 eV to about 2.2 eV. In this regard, a wavelength of the light emitted by the light-emitting layer 33_1 may be in a range of about 550 nm to about 690 nm. For example, in case that the first material layer 340_1 further contains an amount of In in a range of about 0% to 10%, a bandgap energy of light emitted by the light-emitting layer 33_1 may be in a range of about 1.8 eV to about 2.2 eV. For example, the light emitted by the light-emitting layer 33_1 may be a red-wavelength light.

In case that the first material layer 340_1 contains an amount of ZnO equal to or less than about 22% or equal to or greater than about 75%, a bandgap energy of light emitted by the first material layer 340_1 may be lowered to a range of about 2.5 eV to about 2.7 eV. In this regard, a wavelength of the light emitted by the light-emitting layer 33_1 may be in a range from about 450 nm to about 495 nm. For example, the light emitted by the light-emitting layer 33_1 may be blue-wavelength light. However, the disclosure is not limited to this. The ZnO content of the first material layer 340_1 may vary depending on the In content of the first material layer 340_1.

In case that the first material layer 340_1 contains an amount of ZnO in a range of 22% to about 75%, a bandgap energy of light emitted by the first material layer 340_1 may be lowered to a range of about 2.2 eV to about 2.5 eV. In this regard, a wavelength of light emitted by the light-emitting layer 33_1 may be in a range of about 495 nm to about 550 nm. For example, the light emitted by the light-emitting layer 33_1 may be green-wavelength light. However, the disclosure is not limited to this. The ZnO content of the first material layer 340_1 may vary depending on the In content of the first material layer 340_1.

The light-emitting layer 33_1 may include the first material layer 340_1, which includes ZnO and In, and the second material layers 351_1 and 352_1, which include GaN. The light-emitting layer 33_1 may emit blue-, green-, or red-wavelength light depending on the Zn and In contents of the first material layer 340_1. The light-emitting layer 33_1 can emit blue-, green-, or red-wavelength light while minimizing a decrease in quantum efficiency.

The fabrication of the light-emitting element ED will hereinafter be described.

FIGS. 7 through 12 are schematic cross-sectional views illustrating a method of fabricating a light-emitting element according to an embodiment of the disclosure.

First, second, and third directions DR1, DR2, and DR3 may be defined as illustrated in FIGS. 7 through 12. For example, the first and second directions DR1 and DR2 may be orthogonal to each other, and the third direction DR3 may be parallel or orthogonal to the plane where the first and second directions DR1 and DR2 reside. The third direction DR3 may also refer to the direction of extension of each light-emitting element ED or the longitudinal direction of each light-emitting element ED.

Unless otherwise specified, the terms "upper," "on," "above," and the like refer to a direction in which semiconductors may be stacked in each light-emitting element ED, from one surface (or the top surface) of a lower substrate 1000, i.e., a first side in the third direction DR3, the term "top surface" refers to a surface facing the first side in the third direction DR3, the terms "lower," "below," and the like refer to a second side in the third direction DR3, and the term "bottom surface" refers to a surface facing the second side in the third direction DR3.

Figure 7:
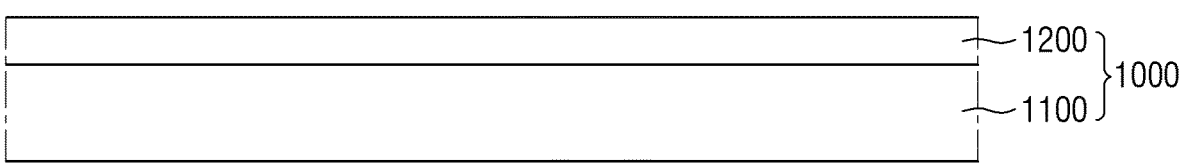
FIGS. 7 through 12 are schematic cross-sectional views illustrating a method of fabricating a light-emitting element according to an embodiment of the disclosure.
Figure 7:
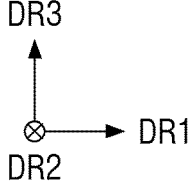

Referring to FIG. 7, the lower substrate 1000 may be prepared.

For example, the lower substrate 1000 may include a base substrate 1100 and a buffer material layer 1200, which may be disposed on the base substrate 1100.

The base substrate 1100 may include a transparent substrate such as a sapphire ($Al_xO_y$) substrate or a glass substrate, but the disclosure is not limited thereto. In other embodiments, the base substrate 1100 may include a conductive substrate such as a GaN, SiC, ZnO, Si, GaP, or GaAs substrate. For example, the base substrate 1100 may be a sapphire ($Al_xO_y$) substrate.

The buffer material layer 1200 may be formed on one surface (or the top surface) of the base substrate 1100. The buffer material layer 1200 may reduce the difference in lattice constant between a first semiconductor material layer 3100, which may be formed on the buffer material layer 1200, and the base substrate 1100.

For example, the buffer material layer 1200 may include an undoped semiconductor. The buffer material layer 1200 may include substantially the same material as the first semiconductor material layer 3100, but not be doped with an n- or p-type dopant or have a lower doping concentration than the first semiconductor material layer 310. The buffer material layer 1200 may include at least one of ZnO, InAlGaN, GaN, AlGaN, InGaN, AlN, and InN, but the disclosure is not limited thereto.

Semiconductor material layers may be formed on the lower substrate 1000. The semiconductor material layers may be formed by growing seed crystals through epitaxial growth. For example, the semiconductor material layers may be formed by electron beam deposition, physical vapor deposition (PVD), chemical vapor deposition (CVD), plasma laser deposition (PLD), dual-type thermal evaporation, sputtering, or metal organic CVD (MOCVD), but the disclosure is not limited thereto.

The type of precursor material for forming the semiconductor material layers is not particularly limited. For example, the precursor material may include a metal precursor including an alkyl group such as a methyl or ethyl group. For example, in an embodiment where first and second semiconductor layers 31 and 32 of each light-emitting element ED include one of AlGaInN, GaN, AlGaN, InGaN, AlN, and InN, the metal precursor may be a compound such as trimethyl gallium ($Ga(CH_3)_3$), trimethyl aluminum ($Al(CH_3)_3$), or triethyl phosphate (($C_2H_5)_3PO_4$), but the disclosure is not limited thereto. In an embodiment where a light-emitting layer 33 of each light-emitting element ED includes one of ZnO, InGaN, and GaN, the metal precursor may also be a compound such as $Ga(CH_3)_3$, $Al(CH_3)_3$, or ($C_2H_5)_3PO_4$, but the disclosure is not limited thereto. The semiconductor material layers may be formed by a deposition process using the metal precursor and a non-metal precursor.

Figure 8:
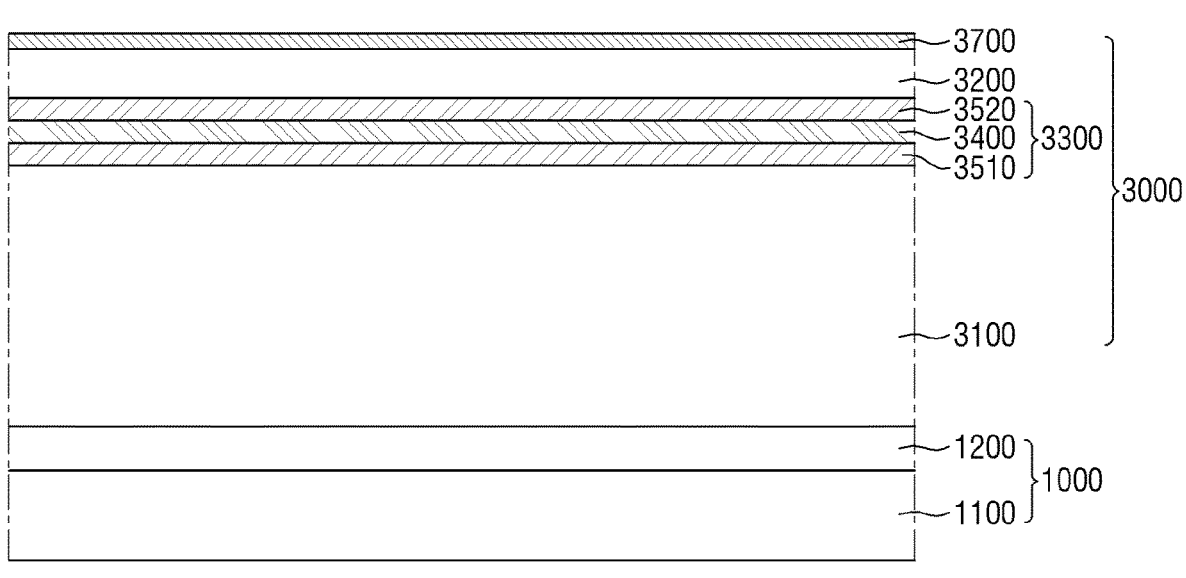
Figure 8:
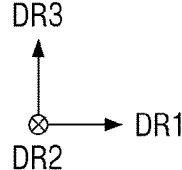

Thereafter, referring to FIG. 8, a first stack structure 3000 may be formed on the lower substrate 1000. For example, a first stack structure 3000 in which the first semiconductor material layer 3100, a light-emitting material layer 3300, a second semiconductor material layer 3200, and an electrode material layer 3700 may be sequentially stacked and may be formed. The light-emitting material layer 3300 may have a multilayer structure in which a first precursor material layer 3400 and second precursor material layers 3510 and 3520 may be alternately stacked.

The layers included in the first stack structure 3000 may correspond to the layers included in each light-emitting element ED. For example, the first semiconductor material layer 3100, the light-emitting material layer 3300, the second semiconductor material layer 3200, and the electrode material layer 3700 of the first stack structure 3000 may correspond to, and include the same materials as, the first semiconductor layer 31, the light-emitting layer 33, the second semiconductor layer 32, and a device electrode layer 37, respectively, of each light-emitting element ED.

The first precursor material layer 3400 and the second precursor material layers 3510 and 3520 of the light-emitting material layer 3300 may correspond to, and include the same materials as, a first material layer 3400 and second material layers 351 and 352, respectively, of each light-emitting element ED. Accordingly, the first precursor material layer 3400 may include ZnO, and the second precursor material layers 3510 and 3520 may include GaN. The light-emitting material layer 3300 may include a semiconductor material, i.e., $(GaN)_{1-x}(ZnO)_x$ (where $0 \le x \le 1$) or GaZnNO.

Figure 9:
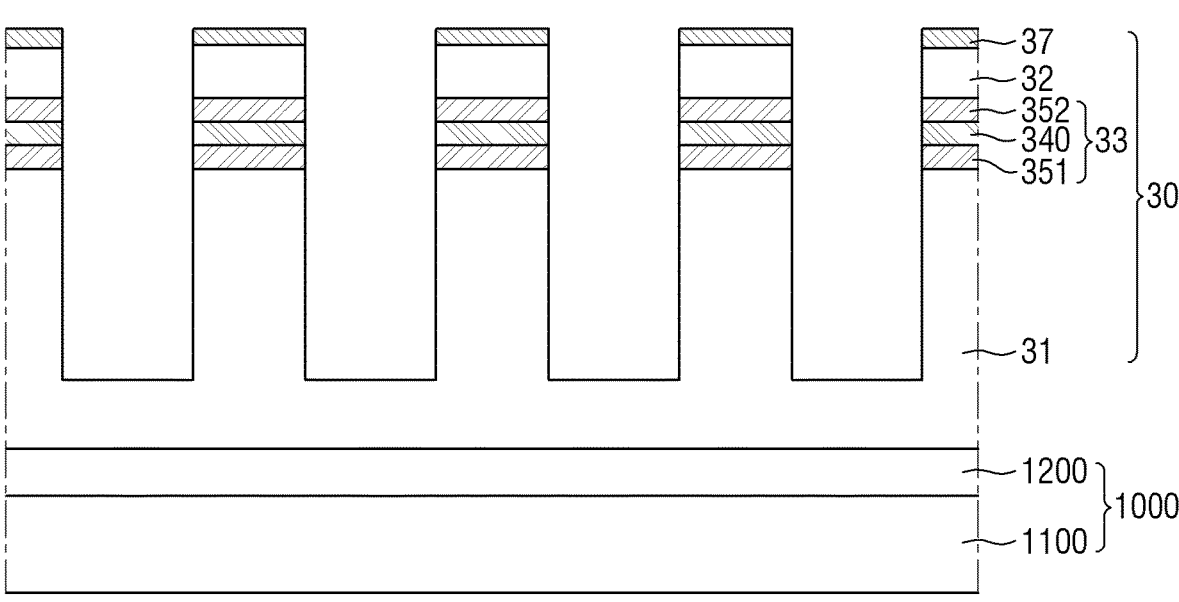
Figure 9:
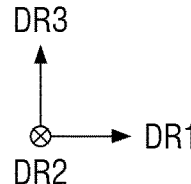

Thereafter, referring to FIG. 9, rod structures 30, which may be spaced apart from one another, may be formed by etching the first stack structure 3000.

For example, the rod structures 30 may be formed by etching the first stack structure 3000 in a direction perpendicular to the top surface of the lower substrate 1000, for example, in the third direction DR3. The first stack structure 3000 may be etched by a typical patterning method. For example, the patterning method may form an etching mask layer on the first stack structure 3000 and etching the first stack structure 3000 along the etching mask layer, in the third direction DR3.

For example, the first stack structure 3000 may be etched by dry etching, wet etching, reactive ion etching (RIE), or inductively coupled plasma (ICP)-RIE. Dry etching allows anisotropic etching and may thus be suitable for vertical etching. The etching of the first stack structure 3000 may be performed by using both dry etching and wet etching. For example, the first stack structure 3000 may be etched in the third direction DR3 through dry etching and may be etched through wet etching such that etched sidewalls may fall on a plane perpendicular to the top surface of the lower substrate 1000.

Figure 10:
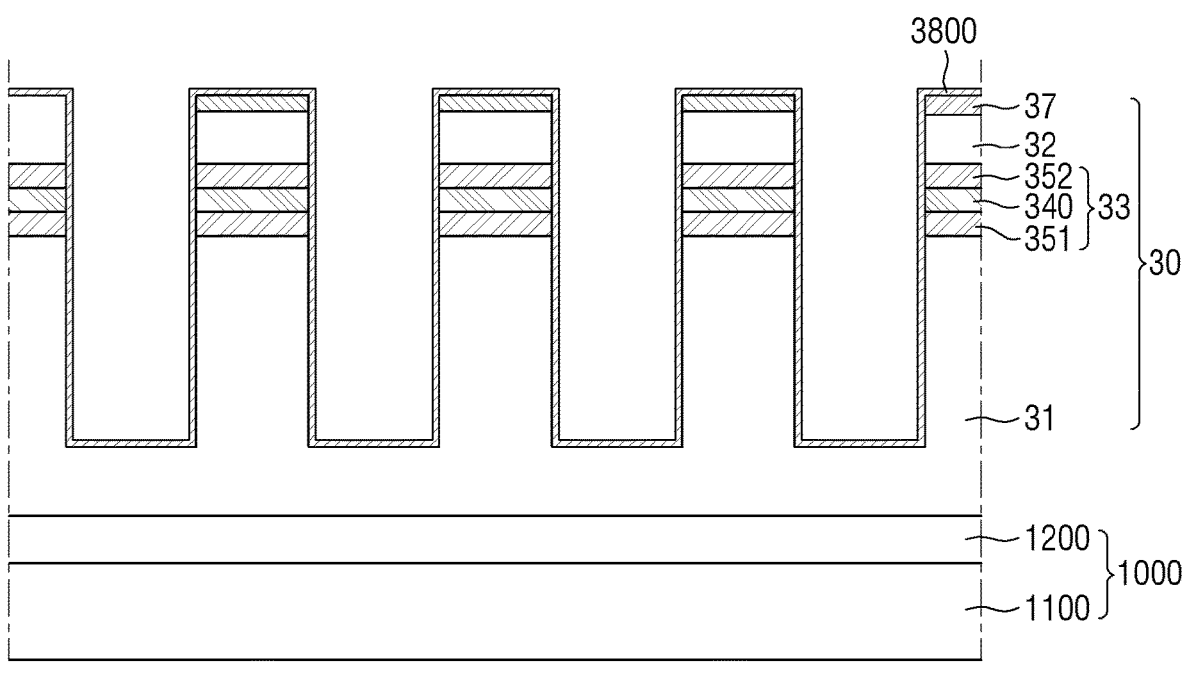
Figure 10:
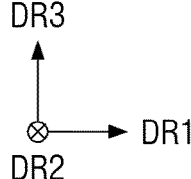

Thereafter, referring to FIG. 10, an insulating material layer 3800 may be formed on the rod structures 30.

After the formation of the rod structures 30, the insulating material layer 3800 may be formed on the rod structures 30 to improve any surface defects that may be generated on the outer surfaces of the semiconductor layers in each of the rod structures 30 during an etching process for forming the rod structures 30. For example, the insulating material layer 3800 may be formed by atomic layer deposition (ALD), thermal ALD, or plasma enhanced ALD (PEALD).

The insulating material layer 3800 may be formed on the entire surface of the lower substrate 1000, not only on the outer surfaces of each of the rod structures 30, but also on parts of the top surface of the lower substrate 1000 exposed by the rod structures 30. The outer surfaces of each of the rod structures 30 may include the top surface and the side of each of the rod structures 30. The insulating material layer 3800 may be disposed directly on the top surfaces and the sides of the rod structures 30. Thus, the insulating material layer 3800 may be disposed directly on, and may directly contact, the sides of the semiconductor layers of each of the rod structures 30.

The insulating material layer 3800 may correspond to an insulating film 38 of each light-emitting element ED.

Figure 11:
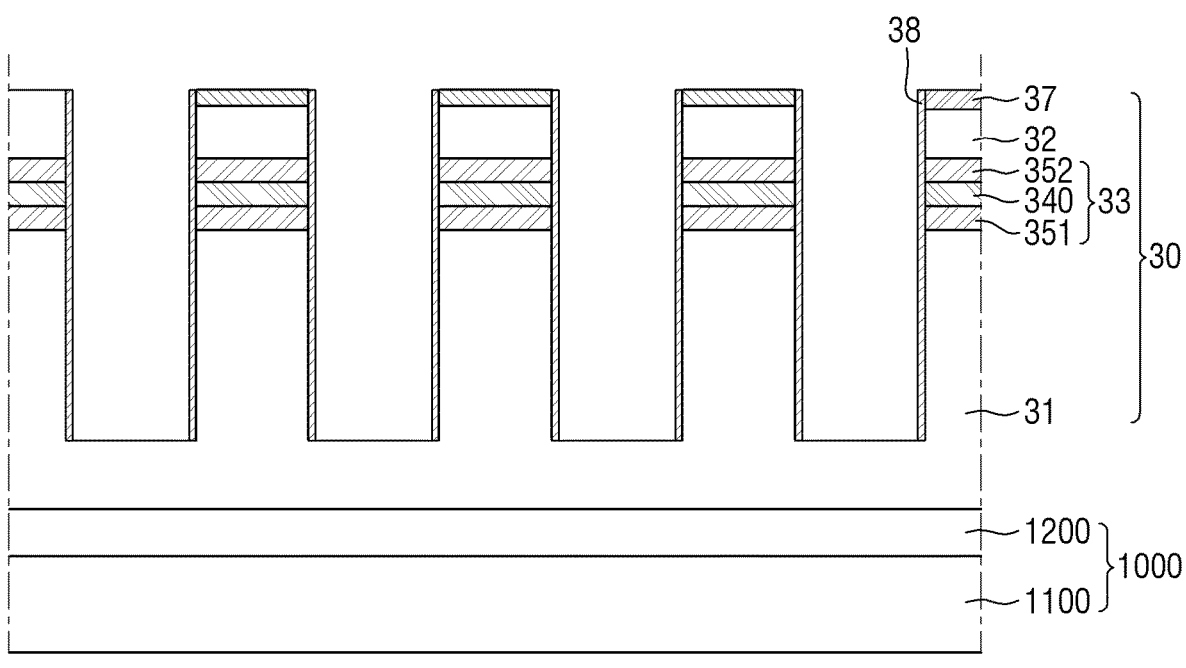
Figure 11:
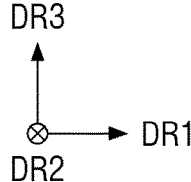

Thereafter, referring to FIG. 11, insulating films 38, which surround the sides of the rod structures 30, may be formed by removing parts of the insulating material layer 3800.

The formation of the insulating films 38 may include performing an etching process to remove parts of the insulating material layer 3800 and thus to expose end surfaces of the rod structures 30, for example, the top surfaces of the device electrode layers 37 of the rod structures 30. The insulating material layer 3800 may be partially removed by anisotropic etching such as a dry etching process or an etch-back process.

The top surfaces of the device electrode layers 37 may be exposed, and each of the insulating films 38 may have a flat top. However, the disclosure is not limited to this. In other embodiments, the insulating films 38 may be formed to be partially curved on the outside, in areas that surround the device electrode layers 37. During the removal of the insulating material layer 3800, not only the top surface of the insulating material layer 3800, but also parts of the insulating material layer 3800 on the sides of the rod structures 30 may be partially removed.

Figure 12:
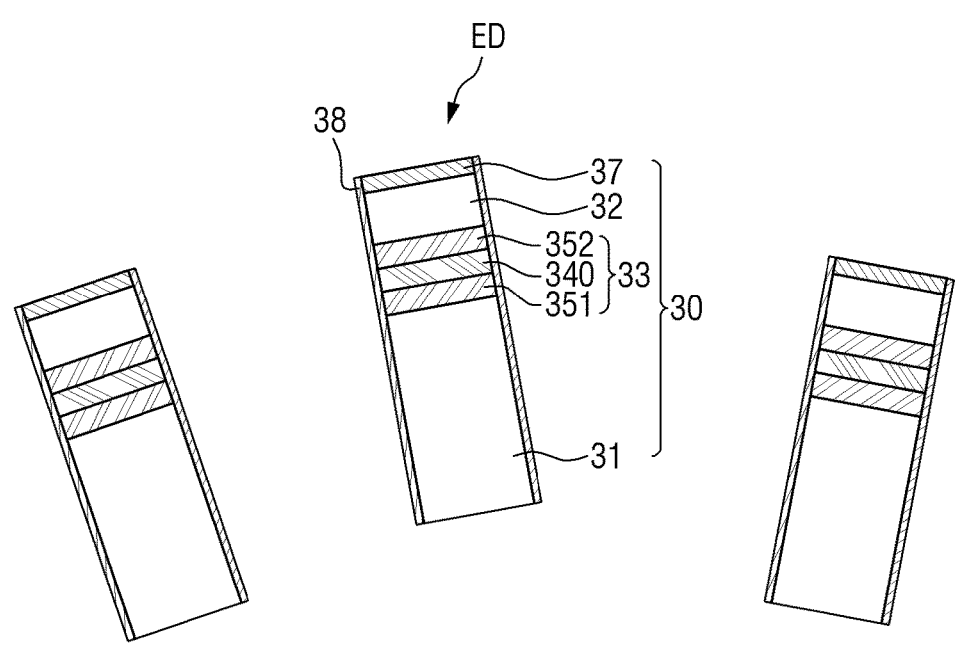
Figure 12:
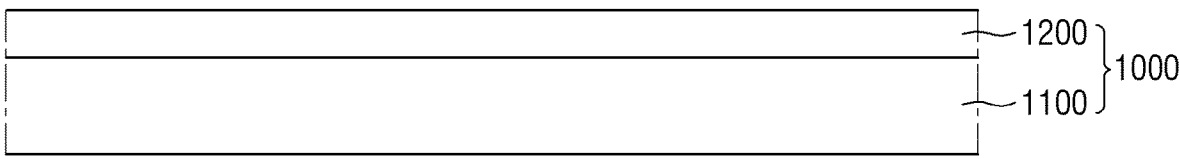
Figure 12:
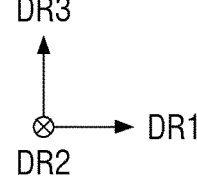

Thereafter, referring to FIG. 12, light-emitting elements ED may be separated from the lower substrate 1000. A method to separate the light-emitting elements ED from the lower substrate 1000 is not particularly limited. For example, the light-emitting elements ED may be separated from the lower substrate 1000 by a physical method or a chemical method.

Figure 13:
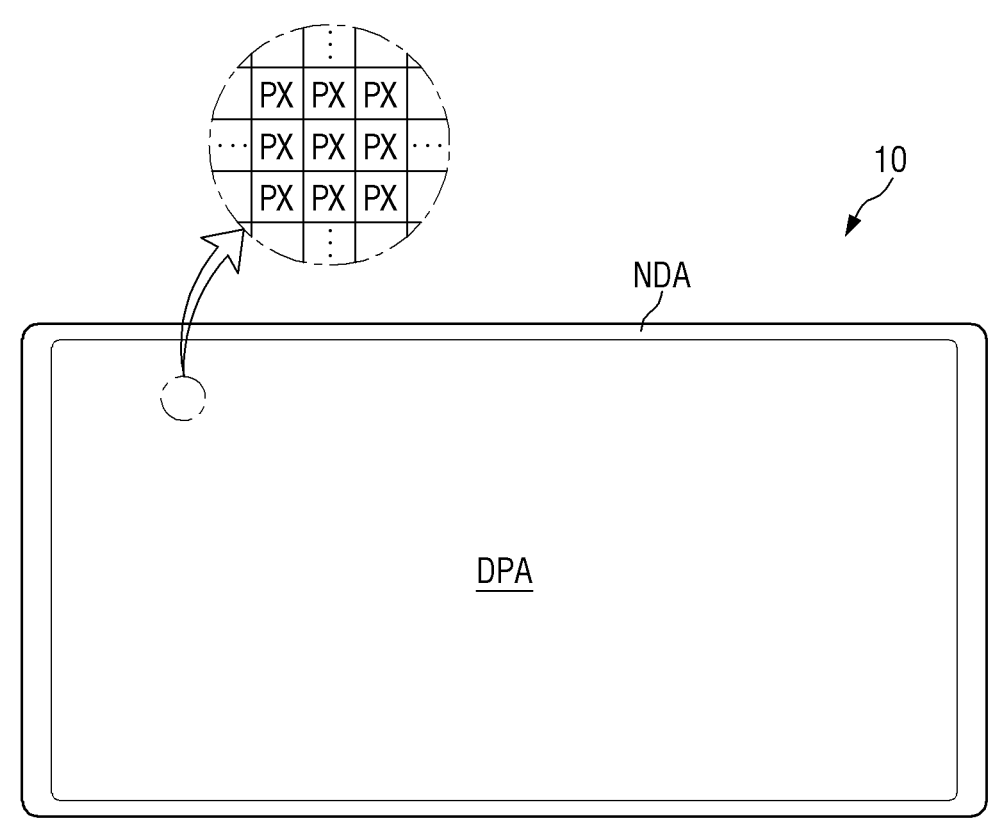
FIG. 13 is a schematic plan view of a display device according to an embodiment of the disclosure.
Figure 13:
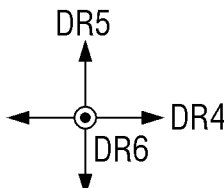

FIG. 13 is a schematic plan view of a display device according to an embodiment of the disclosure.

Referring to FIG. 13, a display device 10 may display a moving image or a still image. The display device 10 may refer to nearly all types of electronic devices that provide a display screen. Examples of the display device 10 may include a television (TV), a notebook computer, a monitor, a billboard, an Internet-of-Things (IoT) device, a mobile phone, a smartphone, a tablet personal computer (PC), an electronic watch, a smartwatch, a watchphone, a head-mounted display (HMD), a mobile communication terminal, an electronic notepad, an electronic book (e-book), a portable multimedia player (PMP), a navigation device, a gaming console, a digital camera, a camcorder, and the like.

The display device 10 may include a display panel that provides a display screen. Examples of the display panel of the display device 10 include an inorganic light-emitting diode (LED) display panel, an organic light-emitting diode (OLED) display panel, a quantum-dot light-emitting diode (QLED) display panel, a plasma display panel (PDP), a field-emission display (FED) panel, and the like. The display panel of the display device 10 will hereinafter be described as being an inorganic LED display panel including light-emitting elements ED, but the disclosure is not limited thereto. For example, various other display panels may be also applicable to the display panel of the display device 10.

Fourth, fifth, and sixth directions DR4, DR5, and DR6 may be defined as illustrated in FIGS. 13 through 18. The fourth and fifth directions DR4 and DR5 may be orthogonal to each other on a single plane. The sixth direction DR6 may be orthogonal to the plane where the fourth and fifth directions DR4 and DR5 reside. The sixth direction DR6 may be orthogonal to both the fourth and fifth directions DR4 and DR5. The sixth direction DR6 refers to the thickness direction of a display device 10.

The display device 10 may have a rectangular shape that extends longer in the fourth direction DR4 than in the fifth direction DR5, in a plan view. The corners where the long sides and the short sides of the display device 10 meet may be right-angled, but the disclosure is not limited thereto. In other embodiments, the corners where the long sides and the short sides of the display device 10 meet may be rounded. The planar shape of the display device 10 is not particularly limited, and the display device 10 may have various other shapes such as a tetragonal shape with rounded corners, a non-tetragonal polygonal shape, or a circular shape.

A display surface of the display device 10 may be disposed on one side, in the sixth direction DR6, of the display device 10. Unless otherwise specified, the terms "upper," "on," "above," and the like refer to the display direction of the display device 10, i.e., a first side in the sixth direction DR6, the term "top surface" refers to a surface facing the first side in the sixth direction DR6, the terms "lower," "below," and the like refer to a second side in the sixth direction DR6, and the term "bottom surface" refers to a surface facing the second side in the sixth direction DR6.

The fourth direction DR4 may be parallel to the third direction DR3 of FIG. 1, which may be the longitudinal direction (or the direction of extension) of the light-emitting element ED of FIG. 1. For example, light-emitting elements ED extending in the third direction DR3 may be arranged in the display device 10, in parallel to the fourth direction DR4.

The display device 10 may include a display area DPA and a non-display area NDA. The display area DPA may be an area where an image may be displayed, and the non-display area NDA may be an area where an image may not be displayed.

The display area DPA may conform to the shape of the display device 10. For example, the display area DPA may have a similar shape to the display device 10, i.e., a rectangular shape, in a plan view. The display area DPA may occupy the middle of the display device 10.

The display area DPA may include pixels PX. The pixels PX may be arranged in row and column directions. The pixels PX may have a rectangular or square shape in a plan view, but the disclosure is not limited thereto. The pixels PX may have a rhombus shape having sides inclined with respect to a particular direction. The pixels PX may in other embodiments be arranged in a stripe type or a PenTile® type.

The non-display area NDA may be disposed around the display area DPA. The non-display area NDA may surround the entire display area DPA or a portion of the display area DPA. The display area DPA may have a rectangular shape, and the non-display area NDA may be disposed adjacent to all the four sides of the display area DPA. The non-display area NDA may form the bezel of the display device 10. Lines or wires, circuit driving units, or pad units where external devices may be mounted may be disposed in the non-display area NDA.

Figure 14:
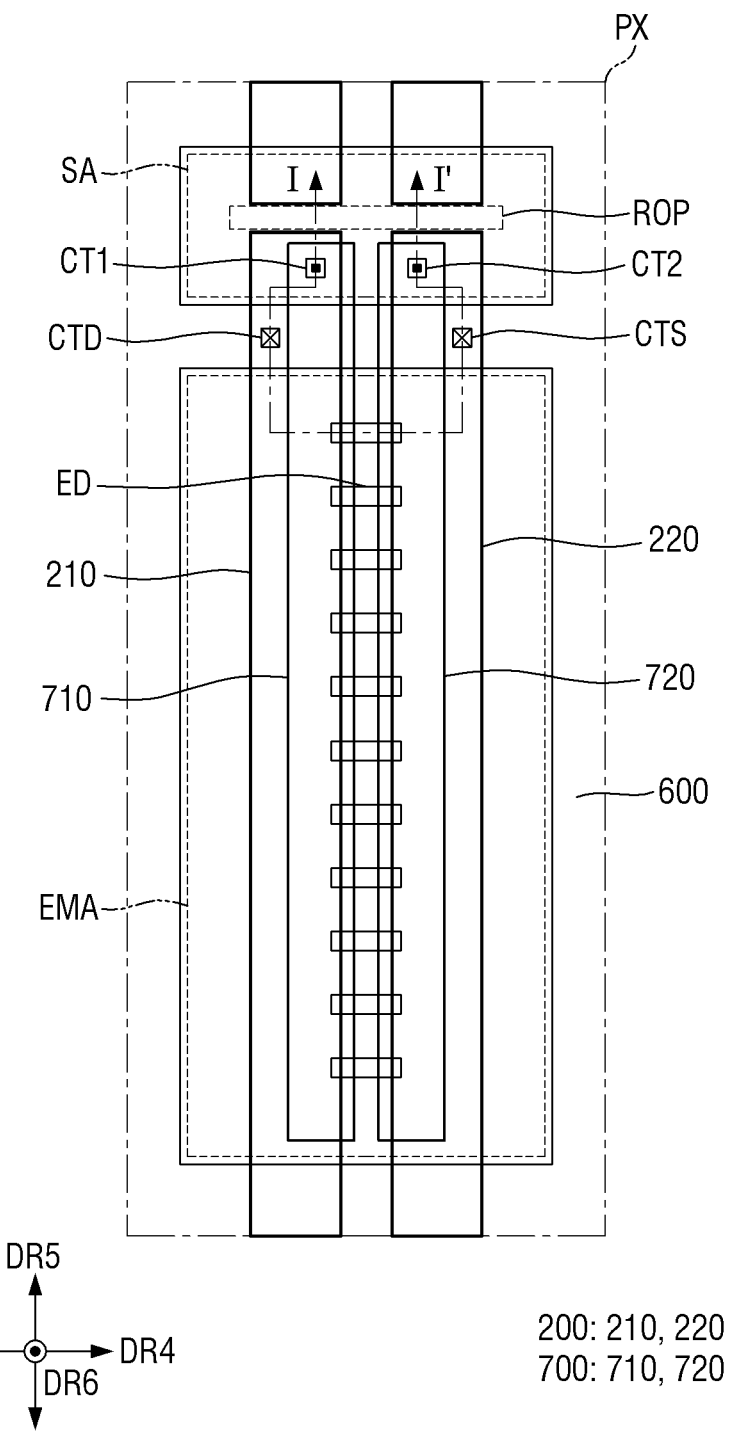
FIG. 14 is a schematic layout view of a pixel of the display device of FIG. 13.

FIG. 14 is a schematic layout view of a pixel of the display device of FIG. 13. FIG. 15 is a schematic cross-sectional view taken along line I-I' of FIG. 14.

Referring to FIG. 14, a pixel PX of the display device 10 may include an emission area EMA and a non-emission area. The emission area EMA may be defined as an area that outputs light emitted by light-emitting elements ED, and the non-emission area may be defined as an area that does not output light because of not being reached by the light emitted by the light-emitting elements ED.

The emission area EMA may include an area where the light-emitting elements ED may be arranged and the surroundings of the area where the light-emitting elements ED may be arranged. The emission area EMA may further include an area that outputs light, emitted by the light-emitting elements ED and reflected or refracted from other members.

The pixel PX may further include a subarea SA, which may be disposed in the non-emission area. The light-emitting elements ED may not be disposed in the subarea SA. The subarea SA may be disposed on the upper side of the emission area EMA, in a plan view. The subarea SA may be disposed between the emission area EMA of the pixel PX of FIG. 14 and an emission area EMA of an upper neighboring pixel PX adjacent to the pixel PX of FIG. 14 in the fifth direction DR5. The subarea SA may include an area where an electrode layer 200 and a connecting electrode 700 may be electrically connected through first and second contacts CT1 and CT2.

The subarea SA may include a separation part ROP. The separation part ROP of the subarea SA may be an area where first and second electrodes 210 and 220 of the pixel PX of FIG. 14, which may be included in the electrode layer 200, may be separated from first and second electrodes 210 and 220 of the upper neighboring pixel PX, which may be also included in the electrode layer 200.

Referring to FIGS. 14 and 15, the display device 10 may include a substrate SUB, a circuit element layer, which may be disposed on the substrate SUB, and a light-emitting element layer, which may be disposed on the circuit element layer.

The substrate SUB may be an insulating substrate. The substrate SUB may be formed of an insulating material such as glass, quartz, or a polymer resin. The substrate SUB may be a rigid substrate or a flexible substrate that may be bendable, foldable, or rollable.

The circuit element layer may be disposed on the substrate SUB. The circuit element layer may include a lower metal layer 110, a semiconductor layer 120, a first conductive layer 130, a second conductive layer 140, a third conductive layer 150, and insulating layers.

The lower metal layer 110 may be disposed on the substrate SUB. The lower metal layer 110 may include a light-blocking pattern BML. The light-blocking pattern BML, may be disposed to cover the channel region of an active layer ACT of at least one transistor TR, but the disclosure is not limited thereto. The light-blocking pattern BML may not be provided.

The lower metal layer 110 may include a material capable of blocking the transmission of light. For example, the lower metal layer 110 may be formed of an opaque metallic material capable of blocking the transmission of light.

The buffer layer 161 may be disposed on the lower metal layer 110. The buffer layer 161 may be disposed to cover the entire surface of the substrate SUB where the lower metal layer 110 may be disposed. The buffer layer 161 may protect the transistor TR from moisture that may penetrate the substrate SUB, which may be susceptible to moisture.

The semiconductor layer 120 may be disposed on the buffer layer 161. The semiconductor layer 120 may include the active layer ACT of the transistor TR. The active layer ACT of the transistor TR may be disposed to overlap the light-blocking pattern BML of the lower metal layer 110.

The semiconductor layer 120 may include polycrystalline silicon, monocrystalline silicon, or an oxide semiconductor. The polycrystalline silicon may be formed by crystallizing amorphous silicon. In case that the semiconductor layer 120 includes polycrystalline silicon, the active layer ACT of the transistor TR may include doped regions doped with impurities and a channel region between the doped regions. The semiconductor layer 120 may include an oxide semiconductor such as, for example, indium tin oxide (ITO), indium zinc oxide (IZO), indium gallium oxide (IGO), indium zinc tin oxide (IZTO), indium gallium zinc oxide (IGZO), indium gallium tin oxide (IGTO), or indium gallium zinc tin oxide (IGZTO).

A gate insulating layer 162 may be disposed on the semiconductor layer 120. The gate insulating layer 162 may function as a gate insulating layer of the transistor TR. The gate insulating layer 162 may be formed as a multilayer in which inorganic layers including at least one inorganic material from among, for example, $SiO_x$, $SiN_x$, and $SiO_xN_y$, may be alternately stacked.

The first conductive layer 130 may be disposed on the gate insulating layer 162. The first conductive layer 130 may include a gate electrode GE of the transistor TR. The gate electrode GE may be disposed to overlap the channel region of the active layer ACT in the thickness direction of the substrate SUB, i.e., in the sixth direction DR6.

A first interlayer insulating layer 163 may be disposed on the first conductive layer 130. The first interlayer insulating layer 163 may be disposed to cover the gate electrode GE. The first interlayer insulating layer 163 may function as an insulating layer between the first conductive layer 130 and layers disposed thereon and may protect the first conductive layer 130.

The second conductive layer 140 may be disposed on the first interlayer insulating layer 163. The second conductive layer 140 may include a drain electrode SD1 and a source electrode SD2 of the transistor TR.

The drain electrode SD1 and the source electrode SD2 of the transistor TR may be electrically connected to both end regions of the active layer ACT of the transistor TR through contact holes penetrating the first interlayer insulating layer 163 and the gate insulating layer 162. The source electrode SD2 of the transistor TR may be electrically connected to the light-blocking pattern BML of the lower metal layer 110 through contact holes penetrating the first interlayer insulating layer 163, the gate insulating layer 162, and the buffer layer 161.

A second interlayer insulating layer 164 may be disposed on the second conductive layer 140. The second interlayer insulating layer 164 may be disposed to cover the drain electrode SD1 and the source electrode SD2 of the transistor TR. The second interlayer insulating layer 164 may function as an insulating layer between the second conductive layer 140 and layers disposed thereon and may protect the second conductive layer 140.

The third conductive layer 150 may be disposed on the second interlayer insulating layer 164. The third conductive layer 150 may include a first voltage line VL1, a second voltage line VL2, and a conductive pattern CDP.

The first voltage line VL1 may overlap at least a portion of the drain electrode SD1 of the transistor TR in the thickness direction of the substrate SUB. A high-potential voltage (or a first power supply voltage) to be supplied to the transistor TR may be applied to the first voltage line VL1.

The second voltage line VL2 may be electrically connected to the second electrode 220 through a second electrode contact hole CTS, which penetrates a via layer 166 and a passivation layer 165. A low-potential voltage (or a second power supply voltage), which may be lower than the high-potential voltage applied to the first voltage line VL1, may be applied to the second voltage line VL2. For example, the high-potential voltage (or the first power supply voltage) to be supplied to the transistor TR may be applied to the first voltage line VL1, and the low-potential voltage (or the second power supply voltage), which may be lower than the high-potential voltage applied to the first voltage line VL1, may be applied to the second voltage line VL2.

The conductive pattern CDP may be electrically connected to the source electrode SD2 of the transistor TR. The conductive pattern CDP may be electrically connected to the source electrode SD2 of the transistor TR through a contact hole penetrating the second interlayer insulating layer 164. The conductive pattern CDP may also be electrically connected to the first electrode 210 through a first electrode contact hole CTD, which penetrates the via layer 166 and the passivation layer 165. The transistor TR may transmit the first power supply voltage applied thereto from the first voltage line VL1 to the first electrode 210 through the conductive pattern CDP.

The passivation layer 165 may be disposed on the third conductive layer 150. The passivation layer 165 may be disposed to cover the third conductive layer 150. The passivation layer 165 may protect the third conductive layer 150.

Each of the buffer layer 161, the gate insulating layer 162, the first interlayer insulating layer 163, the second interlayer insulating layer 164, and the passivation layer 165 may be formed as a stack of inorganic layers. For example, each of the buffer layer 161, the gate insulating layer 162, the first interlayer insulating layer 163, the second interlayer insulating layer 164, and the passivation layer 165 may be formed as a double layer in which inorganic layers including at least one of $SiO_x$, $SiN_x$, and $SiO_xN_y$ may be stacked or a multilayer in which inorganic layers including at least one of $SiO_x$, $SiN_x$, and $SiO_xN_y$ may be alternately stacked, but the disclosure is not limited thereto. In other embodiments, each of the buffer layer 161, the gate insulating layer 162, the first interlayer insulating layer 163, the second interlayer insulating layer 164, and the passivation layer 165 may be formed as a single inorganic layer including $SiO_x$, $SiN_x$, or $SiO_xN_y$.

The via layer 166 may be disposed on the passivation layer 165. The via layer 166 may include an organic insulating material such as, for example, polyimide. The via layer 166 may perform a surface planarization layer. Thus, the top surface (or the surface) of the via layer 166 where the light-emitting element layer may be disposed may generally be flat regardless of the presence and the shape of a pattern below the via layer 166.

The light-emitting element layer may be disposed on the circuit element layer. The light-emitting element layer may be disposed on the via layer 166. The light-emitting element layer may include a first bank 400, the electrode layer 200, a first insulating layer 510, a second bank 600, light-emitting elements ED, and connecting electrodes 700.

The first bank 400 may be disposed on the via layer 166, in the emission area EMA. The first bank 400 may be disposed directly on one surface of the via layer 166. The first bank 400 may protrude, at least in part, from the surface of the via layer 166 in an upward direction (e.g., in a direction toward the first side in the sixth direction DR6). Each of protruding parts of the first bank 400 may have inclined sides. The first bank 400 may have inclined sides and may thus change the traveling direction of light, proceeding toward the sides of the first bank 400 after being emitted from the light-emitting elements ED, to the upward direction (e.g., the display direction of the display device 10).

The first bank 400 may include first and second sub-banks 410 and 420, which may be spaced apart from each other. The first and second sub-banks 410 and 420 may provide space in which to arrange the light-emitting elements ED and may function as reflective barriers capable of changing the traveling direction of light emitted from the light-emitting elements ED to the display direction of the display device 10.

The first bank 400 is illustrated as having linearly inclined sides, but the disclosure is not limited thereto. In other embodiments, the sides (or the outer sides) of the first bank 400 may have a round shape, a semicircular shape, or a semielliptical shape. The first bank 400 may include an organic insulating material such as polyimide, but the disclosure is not limited thereto.

The electrode layer 200 may be disposed to extend in one direction across the emission area EMA and the subarea SA. The electrode layer 200 may transmit, to the light-emitting elements ED, electric signals applied thereto from the circuit element layer to cause the light-emitting elements ED to emit light. The electrode layer 200 may be used to generate an electric field for use in the alignment of the light-emitting elements ED.

The electrode layer 200 may be disposed on the first bank 400 and a portion of the via layer 166 exposed by the first bank 400. The electrode layer 200 may be disposed on the first bank 400, in the emission area EMA, and on the portion of the via layer 166 exposed by the first bank 400, in the non-emission area.

The electrode layer 200 may include first and second electrodes 210 and 220. The first and second electrodes 210 and 220 may be spaced apart from each other.

The first electrode 210 may be disposed on the left side of the center of the pixel PX, in a plan view. The first electrode 210 may extend in the fifth direction DR5 in a plan view. The first electrode 210 may be disposed to extend across the emission area EMA and the subarea SA. The first electrode 210 may extend in the fifth direction DR5, in a plan view, and may be spaced apart from a first electrode 210 of the upper neighboring pixel PX, in the separation part ROP of the subarea SA.

The second electrode 220 may be spaced apart from the first electrode 210 in the fourth direction DR4. The second electrode 220 may be disposed on one side, in the fourth direction DR4, of the center (e.g., on the right side) of the pixel PX. The second electrode 220 may extend in the fifth direction DR5, in a plan view. The second electrode 210 may be disposed to extend across the emission area EMA and the subarea SA. The second electrode 220 may extend in the fifth direction DR5, in a plan view, and may be spaced apart from a second electrode 220 of the upper neighboring pixel PX, in the separation part ROP of the subarea SA.

The first and second electrodes 210 and 220 may be disposed on the first and second sub-banks 410 and 420, in the emission area EMA. The first electrode 210 may extend outwardly beyond the first sub-bank 410 and may thus be disposed on a portion of the via layer 166 exposed by the first sub-bank 410. Similarly, the second electrode 220 may extend outwardly beyond the second sub-bank 420 and may thus be disposed on a portion of the via layer 166 exposed by the second sub-bank 420. The first and second electrodes 210 and 220 may be spaced apart from, and face, each other in the gap between the first and second sub-banks 410 and 420. The via layer 166 may be exposed in the gap between the first and second electrodes 210 and 220.

The first electrode 210 may be spaced apart from the first electrode 210 of the upper neighboring pixel PX by the separation part ROP in the subarea SA. Similarly, the second electrode 220 may be spaced apart from the second electrode 220 of the upper neighboring pixel PX by the separation part ROP in the subarea SA. Thus, the first and second electrodes 210 and 220 may expose the via layer 166, in the separation part ROP of the subarea SA.

The first electrode 210 may be electrically connected to the conductive pattern CDP of the circuit element layer through the first electrode contact hole CTD, which penetrates the via layer 166 and the passivation layer 165. For example, the first electrode 210 may contact a portion of the top surface of the conductive pattern CDP exposed by the first electrode contact hole CTD. The first power supply voltage from the first voltage line VL1 may be transmitted to the first electrode 210 through the conductive pattern CDP.

The second electrode 220 may be electrically connected to the second volage line VL2 of the circuit element layer through the second electrode contact hole CTS, which penetrates the via layer 166 and the passivation layer 165. For example, the second electrode 220 may contact a portion of the top surface of the second voltage line VL2 exposed by the second electrode contact hole CTS. The second power supply voltage from the second voltage line VL2 may be transmitted to the second electrode 220.

The electrode layer 200 may include a conductive material with high reflectance. For example, the electrode layer 200 may include a material with high reflectance such as silver (Ag), copper (Cu), or aluminum (Al) or an alloy containing Al, nickel (Ni), or lanthanum (La). The electrode layer 200 may reflect light, traveling sideways toward the first bank 400 after being emitted from the light-emitting elements ED, in the upward direction.

However, the disclosure is not limited to this. The electrode layer 200 may further include a transparent conductive material. For example, the electrode layer 200 may include a material such as ITO, IZO, or IZTO. In some embodiments, the electrode layer 200 may have a structure in which one or more layers of a transparent conductive material and one or more layers of a metal with high reflectance may be stacked or may be formed as a single layer including a transparent conductive material and a metal with high reflectance. For example, the electrode layer 200 may have a stack structure such as ITO/Ag/ITO, ITO/Ag/IZO, or ITO/Ag/IZTO/IZO.

The first insulating layer 510 may be disposed on the via layer 166 where the electrode layer 200 may be formed. The first insulating layer 510 may protect the electrode layer 200 and may insulate the first and second electrodes 210 and 220 from each other.

The first insulating layer 510 may include an inorganic insulating material. For example, the first insulating layer 510 may include at least one inorganic insulating material from among $SiO_x$, $SiN_x$, $SiO_xN_y$, aluminum oxide ($Al_xO_y$), and aluminum nitride (AlN). The surface of the first insulating layer 510 may reflect the shape of the pattern of the electrode layer 200 disposed therebelow. For example, the first insulating layer 510 may have a stepped structure due to the shape of the electrode layer 200. For example, a portion of the top surface of the first insulating layer 510 may be recessed in the gap between the first and second electrodes 210 and 220 so that the first insulating layer 510 may have a stepped structure. Accordingly, the height of the top surface of the first insulating layer 510 may be greater on the first and second electrodes 210 and 220 than on a portion of the via layer 166 where the first and second electrodes 210 and 220 may not be disposed. Here, the height of the top surface of an arbitrary layer may be measured from a flat reference surface (e.g., the top surface of the via layer 166) where there may be no underlying stepped structure.

The first insulating layer 510 may include the first and second contacts CT1 and CT2, which expose parts of the top surfaces of the first and second electrodes 210 and 220, respectively, in the subarea SA. The first electrode 210 may be electrically connected to a first connecting electrode 710 through the first contact CT1, which penetrates the first insulating layer 510, in the subarea SA, and the second electrode 220 may be electrically connected to a second connecting electrode 720 through the second contact CT2, which penetrates the first insulating layer 510, in the subarea SA.

The second bank 600 may be disposed on the first insulating layer 510. The second bank 600 may include portions extending in the fourth direction DR4 and portions extending in the fifth direction DR5 and may thus be arranged in a lattice pattern.

The second bank 600 may be disposed along the boundaries of the pixel PX to separate the pixel PX from other neighboring pixels PX and may define and separate the emission area EMA and the subarea SA. The second bank 600 may be formed to have a greater height than the first bank 400 and may thus allow ink having the light-emitting elements ED dispersed therein to be properly sprayed into the emission area EMA without being mixed into other neighboring pixels PX, during an inkjet printing process for aligning the light-emitting elements ED.

The light-emitting elements ED may be disposed in the emission area EMA. The light-emitting elements ED may not be disposed in the subarea SA.

The light-emitting elements ED may be disposed on the first insulating layer 510, between the first and second sub-banks 410 and 420. The light-emitting elements ED may be disposed on the first insulating layer 510, between the first and second electrodes 210 and 220.

The light-emitting elements ED may extend in one direction and may be arranged such that both end portions thereof may be disposed on the first and second electrodes 210 and 220. For example, first end portions of the light-emitting elements ED may be disposed on the first electrode 210, and second end portions of the light-emitting elements ED may be disposed on the second electrode 220.

The length, in the fourth direction DR4, of the light-emitting elements ED may be less than the distance between the first and second sub-banks 410 and 420, which may be spaced apart from each other in the fourth direction DR4. The length of the light-emitting elements ED may be greater than the distance between the first and second electrodes 210 and 220, which may be spaced apart from each other in the fourth direction DR4. The distance, in the fourth direction DR4, between the first and second sub-banks 410 and 420 may be greater than the length of the light-emitting elements ED, and the distance, in the fourth direction DR4, between the first and second electrodes 210 and 220 may be less than the length of the light-emitting elements ED. As a result, both end portions of each of the light-emitting elements ED may be placed on the first and second electrodes 210 and 220, between the first and second sub-banks 410 and 420.

The light-emitting elements ED may be spaced apart from one another in the direction in which the first and second electrodes 210 and 220 extend, i.e., in the fifth direction DR5, and may be aligned substantially in parallel to one another.

A second insulating layer 520 may be disposed on the light-emitting elements ED. The second insulating layer 520 may be disposed on the light-emitting elements ED to expose both end portions of each of the light-emitting elements ED. The second insulating layer 520 may be disposed to surround parts of the outer surfaces of each of the light-emitting elements ED, but not to cover both end portions of each of the light-emitting elements ED.

Parts of the second insulating layer 520 that may be disposed on the light-emitting elements ED may extend in the fifth direction DR5, on the first insulating layer 510 to form linear or island patterns in the pixel PX, in a plan view. The second insulating layer 520 may protect and fix the light-emitting elements ED during the fabrication of the display device 10. The second insulating layer 520 may be disposed to fill the space between the first insulating layer 510 and the light-emitting elements ED.

The connecting electrodes 700 may be disposed on the second insulating layer 520. The connecting electrodes 700 may be disposed on the first insulating layer 510 where the light-emitting elements ED may be disposed. The connecting electrodes 700 may include the first and second connecting electrodes 710 and 720, which may be spaced apart from each other.

The first connecting electrode 710 may be disposed on the first electrode 210, in the emission area EMA. The first connecting electrode 710 may extend in the fifth direction DR5 on the first electrode 210. The first connecting electrode 710 may be in contact with the first electrode 210 and the first end portions of the light-emitting elements ED.

The first connecting electrode 710 may be in contact with a portion of the first electrode 210 exposed by the first contact CT1, which penetrates the first insulating layer 510, in the subarea SA, and with the first end portions of the light-emitting elements ED, in the emission area EMA. For example, the first connecting electrode 710 may electrically connect the first electrode 210 and the first end portions of the light-emitting elements ED.

The second connecting electrode 720 may be disposed on the second electrode 220, in the emission area EMA. The second connecting electrode 720 may extend in the fifth direction DR5 on the second electrode 220. The second connecting electrode 720 may contact the second electrode 220 and the second end portions of the light-emitting elements ED.

The second connecting electrode 720 contact a portion of the second electrode 220 exposed by the second contact CT2, which penetrates the first insulating layer 510, in the subarea SA, and with the second end portions of the light-emitting elements ED, in the emission area EMA. For example, the second connecting electrode 720 may electrically connect the second electrode 220 and the second end portions of the light-emitting elements ED.

The first and second connecting electrodes 710 and 720 may be spaced apart from each other on the light-emitting elements ED. For example, the first and second connecting electrodes 710 and 720 may be spaced apart from each other with the second insulating layer 520 interposed therebetween. The first and second connecting electrodes 710 and 720 may be electrically insulated from each other.

The first and second connecting electrodes 710 and 720 may include a same material. For example, the first and second connecting electrodes 710 and 720 may include a conductive material. For example, the first and second connecting electrodes 710 and 720 may include ITO, IZO, IZTO, or Al. For example, the first and second connecting electrodes 710 and 720 may include a transparent conductive material. As the first and second connecting electrodes 710 and 720 include a transparent conductive material, light emitted from the light-emitting elements ED may travel toward the first and second electrodes 210 and 220 through the first and second connecting electrodes 710 and 720 and may thus be reflected by the surfaces of the first and second electrodes 210 and 220.

The first and second connecting electrodes 710 and 720 may include a same material and may be formed in a same layer. The first and second connecting electrodes 710 and 720 may be formed at a same time by a same process.

A third insulating layer 530 may be disposed on the connecting electrodes 700. The third insulating layer 530 may cover the light-emitting element layer therebelow. The third insulating layer 530 may include the first bank 400, the electrode layer 200, the first insulating layer 510, the light-emitting elements ED, and the connecting electrodes 700. The third insulating layer 530 may be disposed on the second bank 600 to cover the second bank 600.

The third insulating layer 530 may protect the light-emitting element layer from a foreign material such as moisture/oxygen or dust. The third insulating layer 530 may protect the first bank 400, the electrode layer 200, the first insulating layer 510, the light-emitting elements ED, and the connecting electrodes 700.

Figure 16:
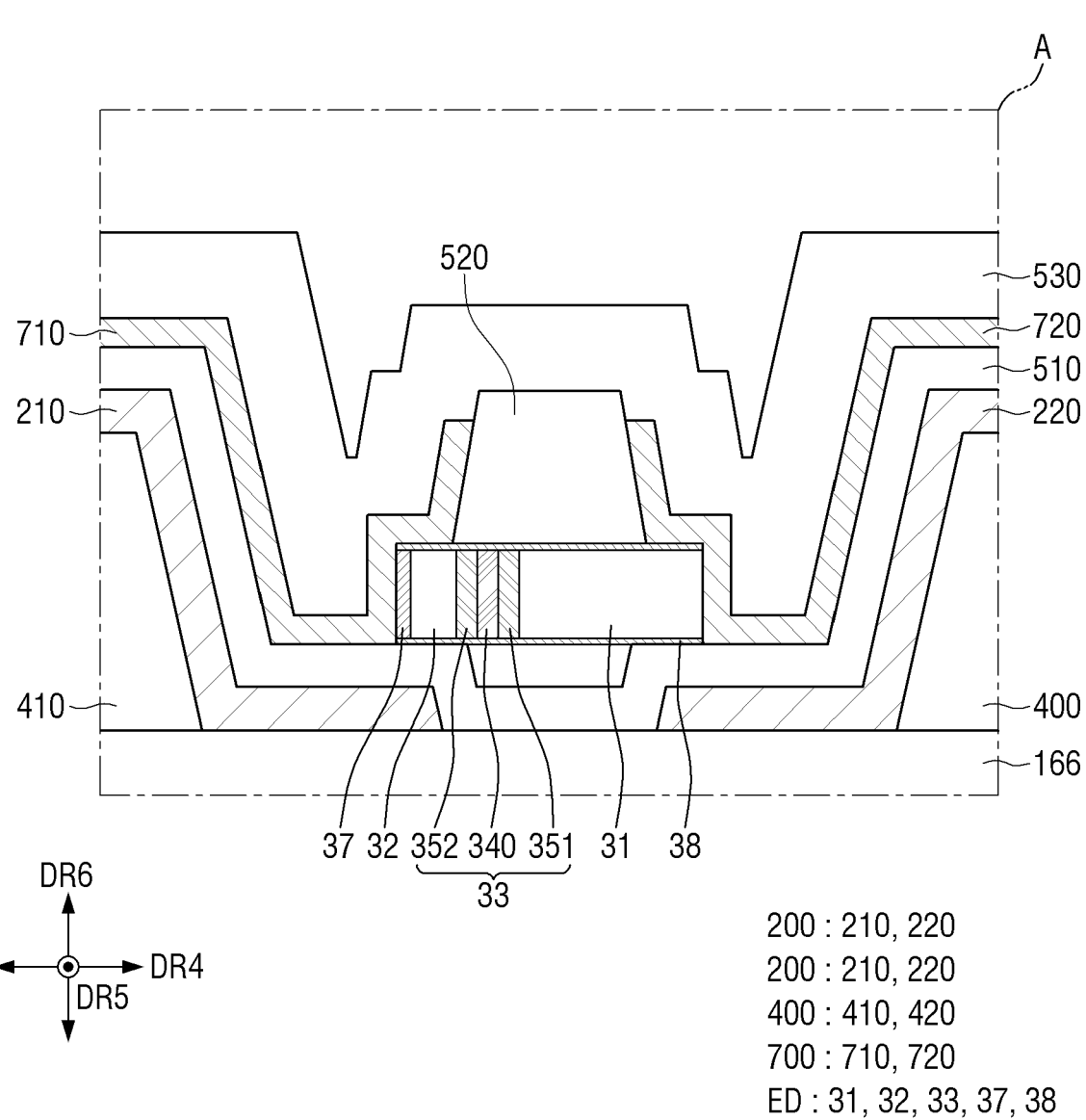
FIG. 16 is an enlarged schematic cross-sectional view of an area A of FIG. 15.

FIG. 16 is an enlarged schematic cross-sectional view of an area A of FIG. 15.

Referring to FIG. 16, the light-emitting elements ED may be arranged such that the direction of extension of the light-emitting elements ED, i.e., the longitudinal direction DR3 of FIG. 1, may be parallel to one surface of the substrate SUB. Semiconductor layers included in each of the light-emitting elements ED may be sequentially arranged in a direction parallel to the top surface of the substrate SUB (or the top surface of the via layer 166). For example, a first semiconductor layer 31, a light-emitting layer 33, and a second semiconductor layer 32 may be sequentially arranged in each of the light-emitting elements ED, in parallel to the top surface of the substrate SUB. A first material layer 340 and second material layers 351 and 352 may be alternately arranged in the light-emitting layer 33, in parallel to the top surface of the substrate SUB.

In a cross-sectional view taken across both end portions of each of the light-emitting elements ED, the first semiconductor layer 31, the second material layer 351, the first material layer 340, the second material layer 352, the second semiconductor layer 32, and the device electrode layer 37 may be sequentially formed in the direction parallel to the top surface of the substrate SUB. Here, the direction parallel to the top surface of the substrate SUB refers to the fourth or fifth direction DR4 or DR5, and semiconductor layers may be sequentially arranged in each of the light-emitting elements ED along the fourth direction DR4.

The first end portions of the light-emitting elements ED may be disposed on the first electrode 210, and the second end portions of the light-emitting elements ED may be disposed on the second electrode 220. However, the disclosure is not limited to this. In other embodiments, the first end portions of the light-emitting elements ED may be disposed on the second electrode 220, and the second end portions of the light-emitting elements ED may be disposed on the first electrode 210.

Figure 17:
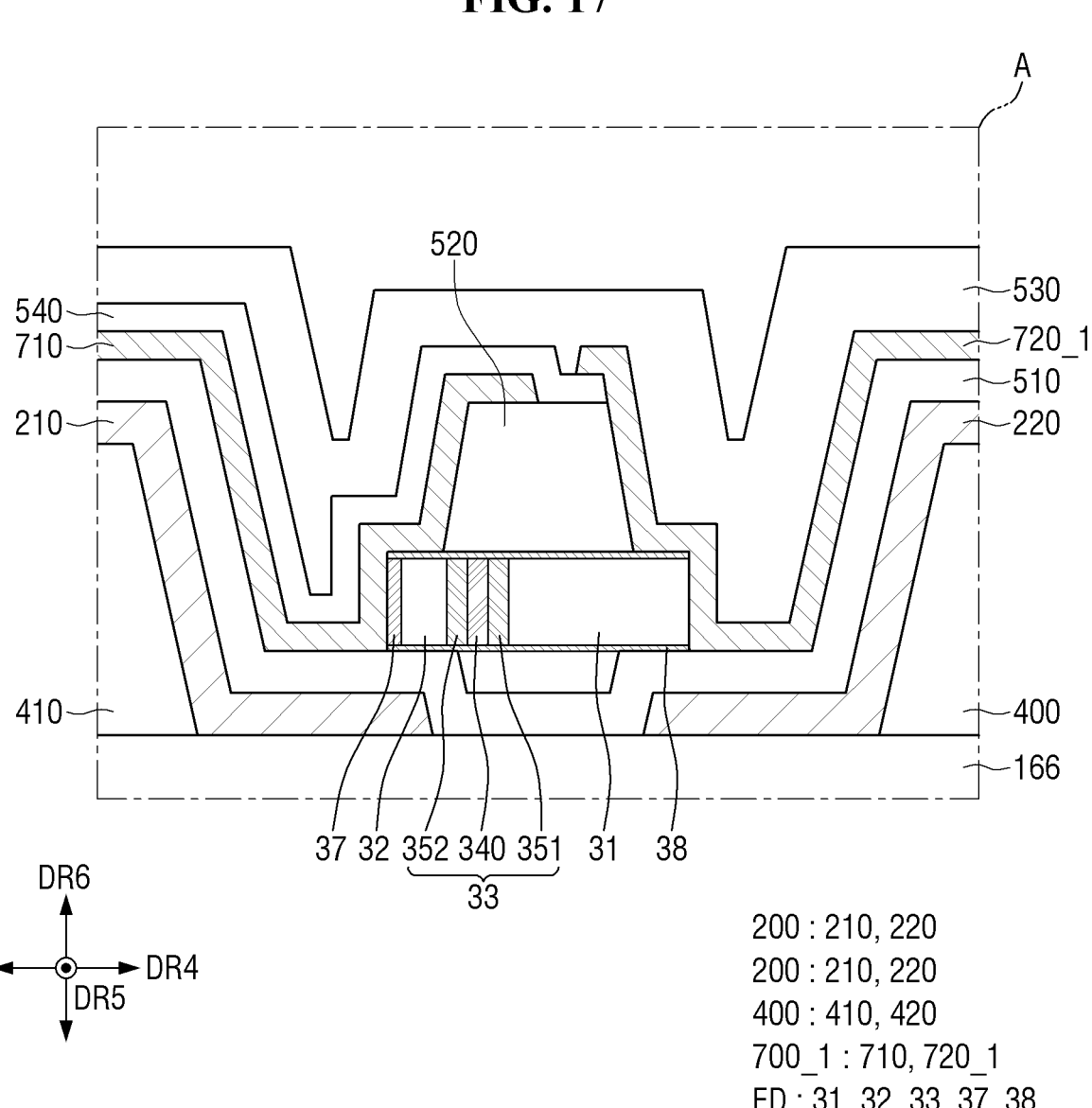
FIG. 17 is an enlarged schematic cross-sectional view of the area A of FIG. 15.

FIG. 17 is an enlarged cross-sectional view of an area A of FIG. 15.

The embodiment of FIG. 17 differs from the embodiment of FIG. 16 in that connecting electrodes 700_1 may include first and second connecting electrodes 710 and 720_1, which may be formed in different layers, and a fourth insulating layer 540 may be further provided.

Referring to FIG. 17, the connecting electrodes 700_1 may include the first and second connecting electrodes 710 and 720_1, which may be formed in different layers.

The first connecting electrode 710 may be disposed on the first electrode 210 and the first end portions of the light-emitting elements ED. The first connecting electrode 710 may extend from the first end portions of the light-emitting elements ED to the second insulating layer 520 and may thus be disposed even on a first side and the top surface of the second insulating layer 520. The first connecting electrode 710 may be disposed on the top surface of the second insulating layer 520 to expose at least a portion of the top surface of the second insulating layer 520.

The fourth insulating layer 540 may be disposed on the first connecting layer 710. The fourth insulating layer 540 may be disposed to completely cover the first connecting electrode 710. The fourth insulating layer 540 may be disposed to completely cover the first side and the top surface of the second insulating layer 520, but may not be disposed on a second side of the second insulating layer 520. The end of the fourth insulating layer 540 may be aligned with the second side of the second insulating layer 520.

The second connecting electrode 720_1 may be disposed on the second electrode 220 and the second end portions of the light-emitting elements ED. The second connecting electrode 720_1 may extend from the second end portions of the light-emitting elements ED to the second insulating layer 520 and may thus be disposed even on the second side of the second insulating layer 520 and the top surface of the fourth insulating layer 540.

The third insulating layer 530 may be disposed on the fourth insulating layer 540 and the second connecting electrode 720_1. The third insulating layer 530 may be disposed on the fourth insulating layer 540 and the second connecting electrode 720_1 to cover the fourth insulating layer 540 and the second connecting electrode 720_1.

Accordingly, as the first and second connecting electrodes 710 and 720_1 may be formed in different layers and the fourth insulating layer 540 may be interposed between the first and second connecting electrodes 710 and 720_1, any short circuit between the first and second connecting electrodes 710 and 720_1 may be minimized, and the reliability of the display device 10 may be improved.

Figure 18:
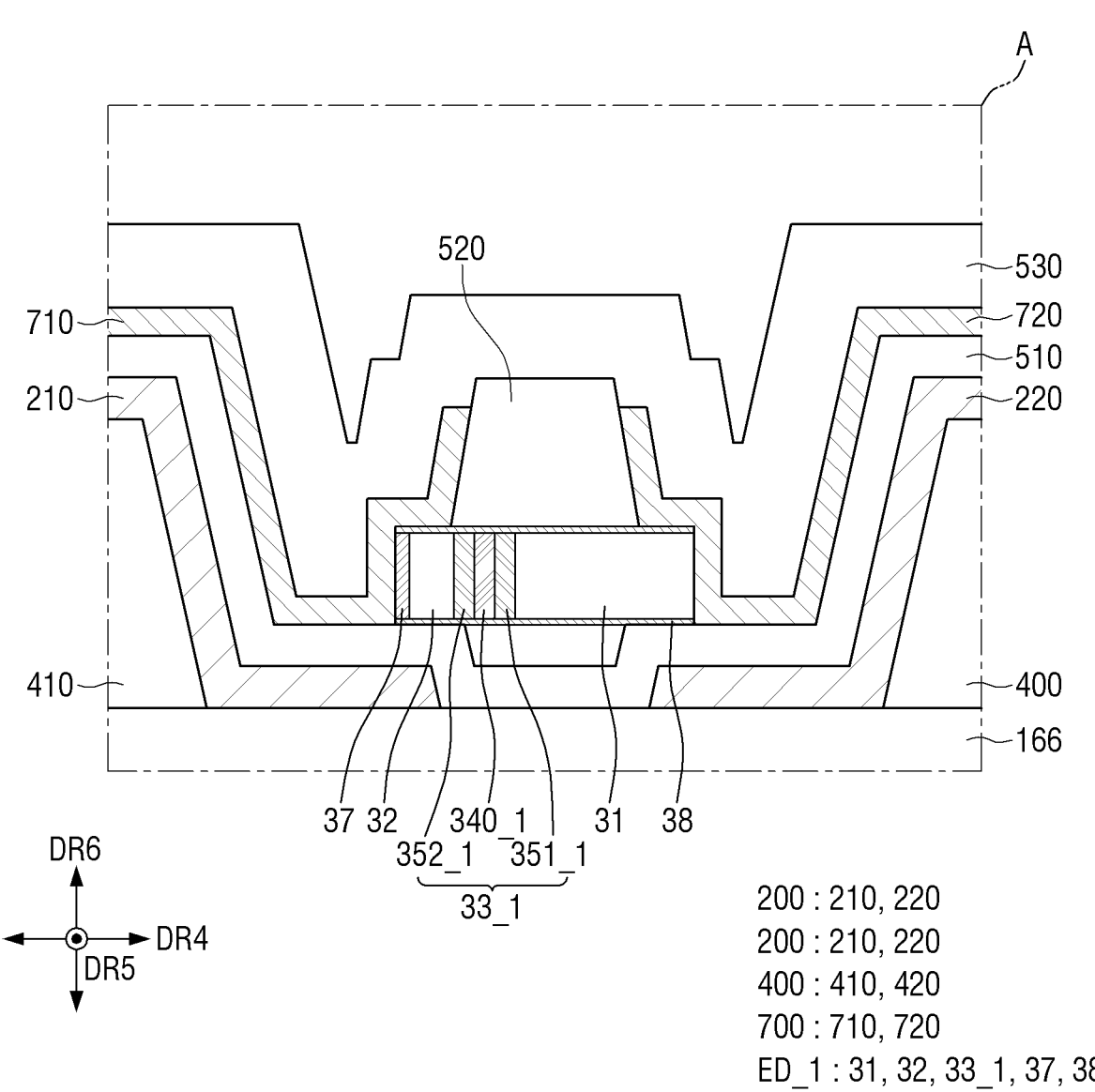
FIG. 18 is an enlarged schematic cross-sectional view of the area A of FIG. 15.

FIG. 18 is an enlarged schematic cross-sectional view of the area A of FIG. 15.

The embodiment of FIG. 18 differs from the previous embodiments at least in that the display device 10 may include light-emitting elements ED_1. Referring to FIG. 18, the light-emitting elements ED_1 may be arranged on one surface of the substrate SUB such that the direction of extension of the light-emitting elements ED_1 (i.e., the longitudinal direction DR3 of FIG. 6) may be parallel to one surface of the substrate SUB. For example, a first semiconductor layer 31, a light-emitting layer 33_1, and a second semiconductor layer 32 may be sequentially arranged in each of the light-emitting elements ED_1, in parallel to the top surface of the substrate SUB. A first material layer 340_1 and second material layers 351_1 and 352_1 may be alternately arranged in the light-emitting layer 33_1, in parallel to the top surface of the substrate SUB.

For example, the first semiconductor layer 31, the second material layer 351_1, the first material layer 340_1, the second material layer 352_1, the second semiconductor layer 32, and the device electrode layer 37 may be sequentially formed in a direction parallel to the top surface of the substrate SUB.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the claims.

What is claimed is:

1. A light-emitting element comprising:
a first semiconductor layer doped with a first-type dopant;
a second semiconductor layer doped with a second-type dopant; and
a light-emitting layer disposed between the first and second semiconductor layers, wherein
the light-emitting element has a rod shape having an aspect ratio in a range of about 1.2:1 to about 100:1,
the light-emitting layer includes:
at least one first material layer; and
at least one second material layer,
the at least one first material layer is a quantum well layer in which electrons and holes recombine and is made of a zinc oxide (ZnO), and
the at least one second material layer is a barrier layer and is made of a gallium nitride (GaN).

2. The light-emitting element of claim 1, wherein the light-emitting layer is a multilayer in which a plurality of first material layers and a plurality of second material layers are alternately stacked.

3. The light-emitting element of claim 1, wherein a bandgap energy of the at least one first material layer is less than a bandgap energy of the at least one second material layer.

4. The light-emitting element of claim 1, wherein
an averaged composition of GaN and ZnO in the light-emitting layer is $(GaN)_{1-x}(ZnO)_x$, and
x is in a range of about 0.22 to about 0.75.

5. The light-emitting element of claim 4, wherein a wavelength of light emitted from the light-emitting layer is in a range of about 450 nm to about 495 nm.

6. The light-emitting element of claim 1, wherein
an averaged composition of GaN and ZnO in the light-emitting layer is $(GaN)_{1-x}(ZnO)_x$, and
x is equal to or less than about 0.22.

7. The light-emitting element of claim 6, wherein a wavelength of light emitted from the light-emitting layer is in a range of about 495 nm to about 550 nm.

8. The light-emitting element of claim 1, wherein a bandgap energy of the light-emitting layer is in a range of about 2.2 eV to about 2.7 eV.

9. The light-emitting element of claim 8, wherein light emitted from the light-emitting layer has a quantum efficiency equal to or greater than about 79%.

10. The light-emitting element of claim 1, wherein a rate of lattice mismatch between the at least one first material layer and the at least one second material layer is equal to or less than about 1.8%.

11. The light-emitting element of claim 1, wherein the at least one first material layer further includes indium (In).

12. The light-emitting element of claim 11, wherein a wavelength of light emitted from the light-emitting layer is in a range of about 550 nm to about 690 nm.

13. The light-emitting element of claim 11, wherein a bandgap energy of the light-emitting layer is in a range of about 1.8 eV to about 2.2 eV.

14. The light-emitting element of claim 11, wherein an In content of the first material layer is equal to or less than about 10%.

15. The light-emitting element of claim 1, further comprising:
a device electrode layer disposed on the second semiconductor layer; and
an insulating film surrounding outer surfaces of each of the first semiconductor layer, the light-emitting layer, and the second semiconductor layer.

16. An electronic device comprising:
a first electrode and a second electrode, each disposed on a substrate and spaced apart from each other;
a light-emitting element disposed between the first and second electrodes, the light-emitting element having a first end portion and a second end portion;
a first connecting electrode contacting the first end portion of the light-emitting element; and a second connecting electrode contacting the second end portion of the light-emitting element, wherein
the light-emitting element has a rod shape having an aspect ratio in a range of about 1.2:1 to about 100:1,
the light-emitting element includes:
a first semiconductor layer;
a second semiconductor layer; and
a light-emitting layer, which is disposed between the first semiconductor layer and the second semiconductor layer, and the light-emitting layer includes:
at least one first material layer, which is a quantum well layer in which electrons and holes recombine and is made of a zinc oxide (ZnO); and
at least one second material layer, which is a barrier layer and is made of a gallium nitride (GaN).

17. The electronic device of claim 16, wherein
an averaged composition of GaN and ZnO in the light-emitting layer is $(GaN)_{1-x}(ZnO)_x$, and
x is in a range of about 0.22 to about 0.75.

18. The electronic device of claim 16, wherein the at least one first material layer further includes indium (In) in an amount equal to or less than about 10%.

19. An electronic device comprising:
a first electrode and a second electrode, each disposed on a substrate and spaced apart from each other;
a light-emitting element disposed between the first and second electrodes, the light-emitting element having a first end portion and a second end portion;
a first connecting electrode contacting the first end portion of the light-emitting element; and
a second connecting electrode contacting the second end portion of the light-emitting element, wherein
the light-emitting element includes:
a first semiconductor layer;
a second semiconductor layer; and
a light-emitting layer, which is disposed between the first semiconductor layer and the second semiconductor layer, the light-emitting layer includes:
at least one first material layer, which is a quantum well layer in which electrons and holes recombine and is made of a zinc oxide (ZnO); and
at least one second material layer, which is a barrier layer and is made of a gallium nitride (GaN), and
the at least one first material layer and the at least second material layer are alternately arranged in a direction parallel to one surface of the substrate.

* * * * *